(12) United States Patent
Lee et al.

(10) Patent No.: US 12,557,446 B2
(45) Date of Patent: Feb. 17, 2026

(54) DISPLAY DEVICE

(71) Applicants: LG ELECTRONICS INC., Seoul (KR); LG DISPLAY CO., LTD., Seoul (KR)

(72) Inventors: Hongcheol Lee, Seoul (KR); Doohwan Yang, Seoul (KR); Youngdo Kim, Seoul (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/706,161

(22) PCT Filed: Nov. 1, 2021

(86) PCT No.: PCT/KR2021/015518
§ 371 (c)(1),
(2) Date: Apr. 30, 2024

(87) PCT Pub. No.: WO2023/074972
PCT Pub. Date: May 4, 2023

(65) Prior Publication Data
US 2024/0421264 A1 Dec. 19, 2024

(51) Int. Cl.
*H10H 20/85* (2025.01)
*H01L 25/16* (2023.01)
*H10H 20/857* (2025.01)

(52) U.S. Cl.
CPC ....... *H10H 20/8506* (2025.01); *H01L 25/167* (2013.01); *H10H 20/857* (2025.01)

(58) Field of Classification Search
CPC .. H10H 20/8506; H10H 20/857; H10H 29/03; H10H 29/37; H10H 29/39;
(Continued)

(56) References Cited

U.S. PATENT DOCUMENTS

2009/0230417 A1* 9/2009 Tsai ............... H01L 33/486
257/E33.056
2013/0193464 A1 8/2013 Bae et al.
(Continued)

FOREIGN PATENT DOCUMENTS

CN 103187512 A 7/2013
KR 10-2019-0104277 A 9/2019
(Continued)

OTHER PUBLICATIONS

The International Search Report (PCT/ISA/210) issued in PCT/KR2021/015518, dated Jul. 28, 2022.

*Primary Examiner* — Su C Kim
(74) *Attorney, Agent, or Firm* — Birch, Stewart, Kolasch & Birch, LLP

(57) ABSTRACT

A display device includes a substrate, a first assembly wiring and second assembly wiring on the substrate, a first insulating layer on the first and second assembly wirings, a barrier wall comprising a hole on the first insulating layer, a semiconductor light emitting device in the hole, and a connection part is configured to electrically connect a side of the semiconductor light emitting device and at least one assembly wiring of the first and second assembly wirings. A gap between an inner surface of the hole and an outer surface of the semiconductor light emitting device is 50% to 200% of a thickness of the semiconductor light emitting device.

20 Claims, 19 Drawing Sheets

(58) Field of Classification Search
CPC .. H10H 29/142; H10H 20/852; H01L 25/167; H10D 30/6729; H10D 86/441; H10D 86/451
See application file for complete search history.

(56) References Cited

U.S. PATENT DOCUMENTS

| | | |
|---|---|---|
| 2018/0233536 A1 | 8/2018 | Chang |
| 2019/0393387 A1* | 12/2019 | Kwon .................... H01L 27/15 |
| 2020/0251451 A1* | 8/2020 | Schuele ............... H10H 20/831 |
| 2021/0265327 A1 | 8/2021 | Koo et al. |
| 2022/0093828 A1 | 3/2022 | Kwag et al. |
| 2022/0254961 A1 | 8/2022 | Chang et al. |
| 2022/0320057 A1 | 10/2022 | Hwang et al. |
| 2022/0351993 A1 | 11/2022 | Jeong et al. |
| 2023/0005887 A1 | 1/2023 | Kwon et al. |

FOREIGN PATENT DOCUMENTS

| | | |
|---|---|---|
| KR | 10-2019-0105537 A | 9/2019 |
| KR | 10-2020-0007498 A | 1/2020 |
| KR | 10-2020-0026681 A | 3/2020 |
| KR | 10-2020-0026775 A | 3/2020 |
| KR | 10-2020-0063380 A | 6/2020 |
| KR | 10-2021-0098313 A | 8/2021 |
| WO | WO 2021/040066 A1 | 3/2021 |
| WO | WO 2021/107237 A1 | 6/2021 |

* cited by examiner

[FIG.1]
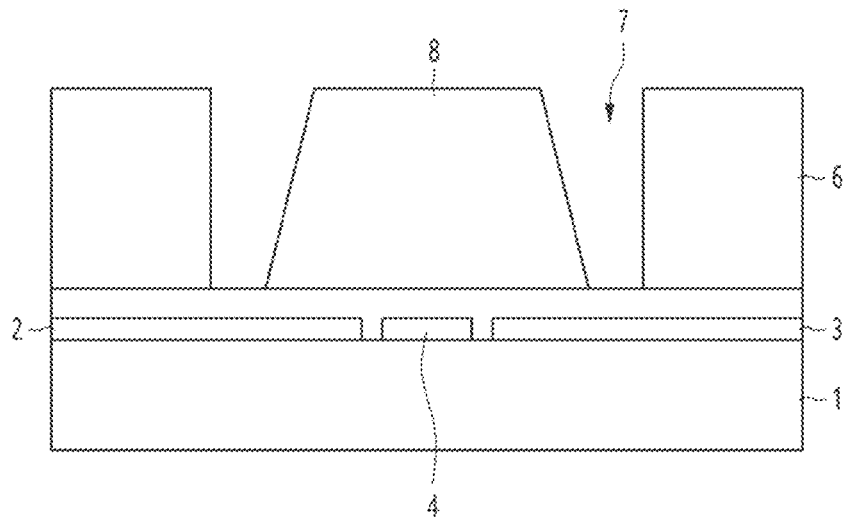
[FIG. 2]
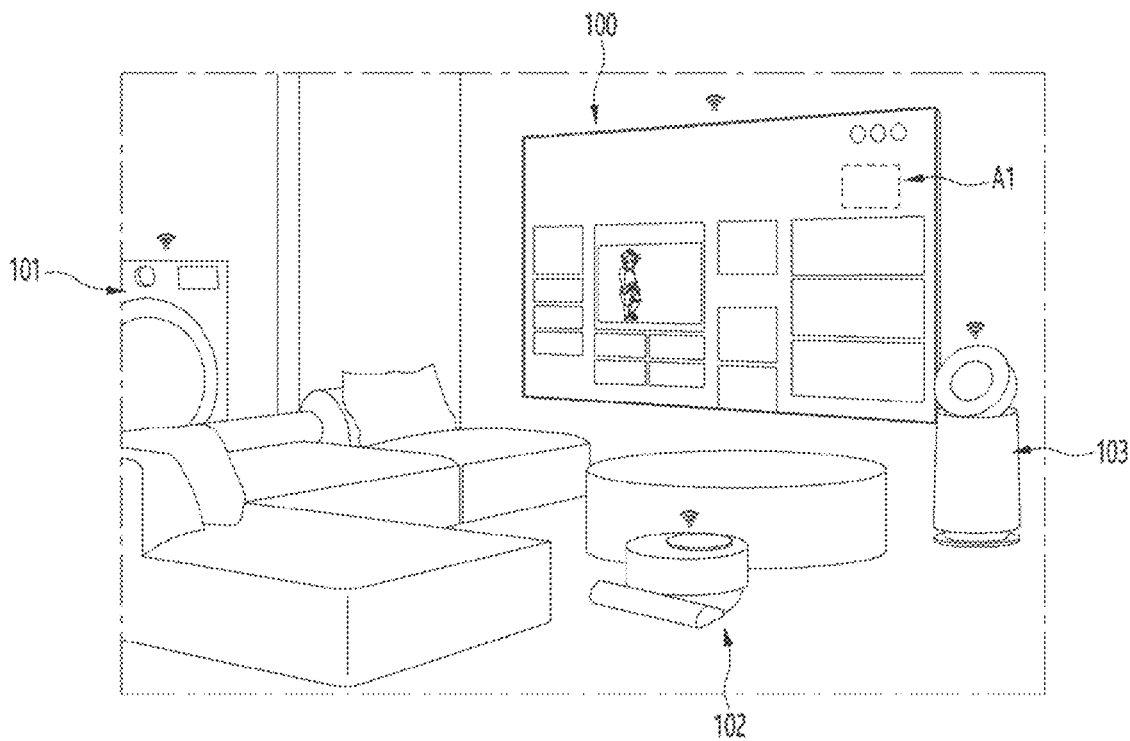

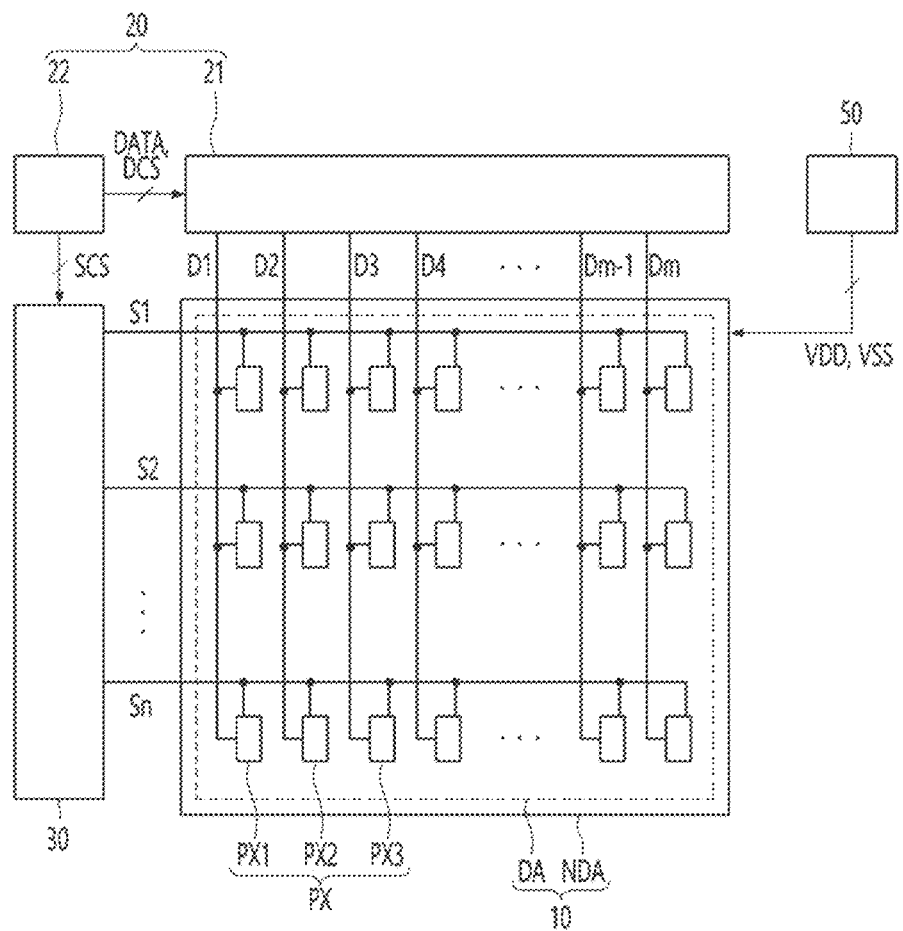
[FIG. 3]

[FIG. 4]
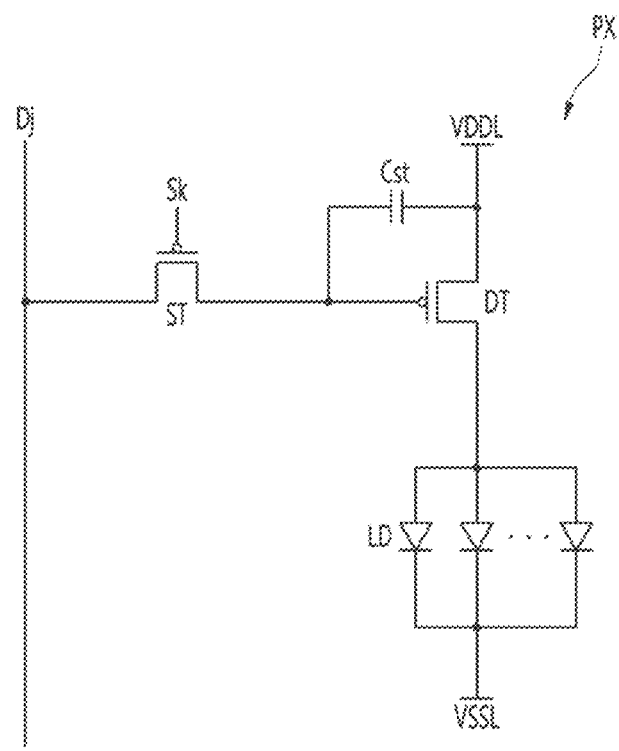

[FIG. 5]
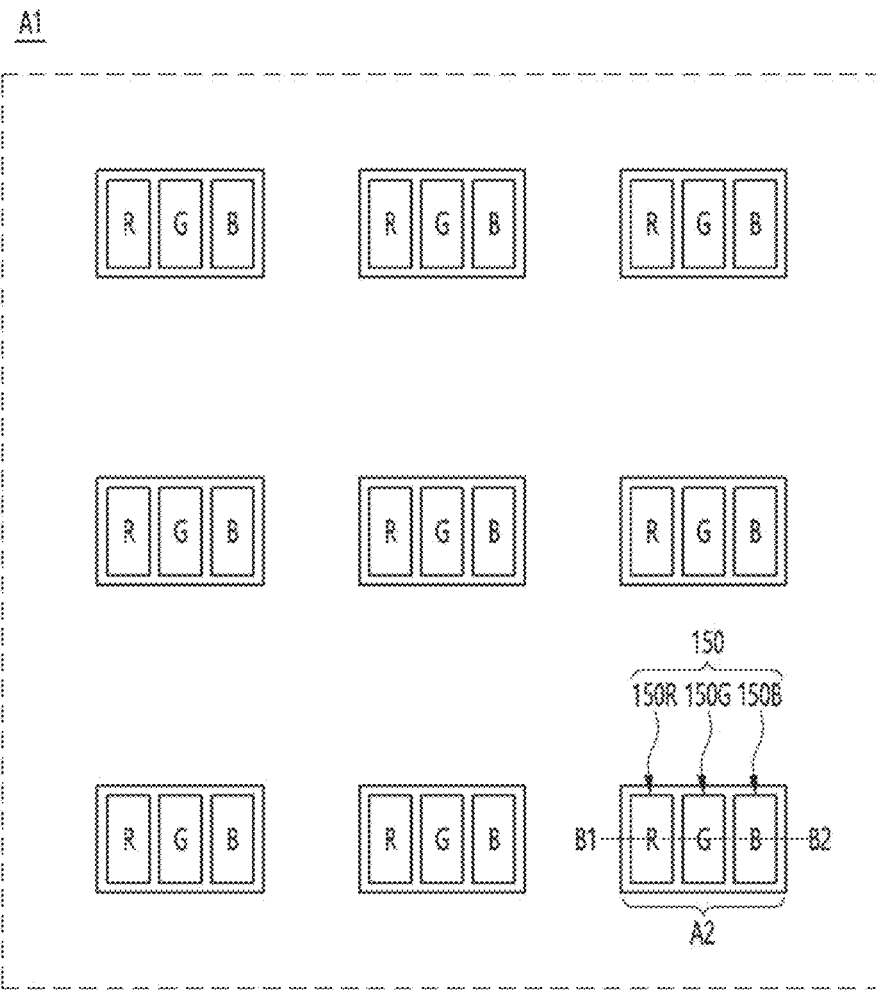
[FIG. 6]
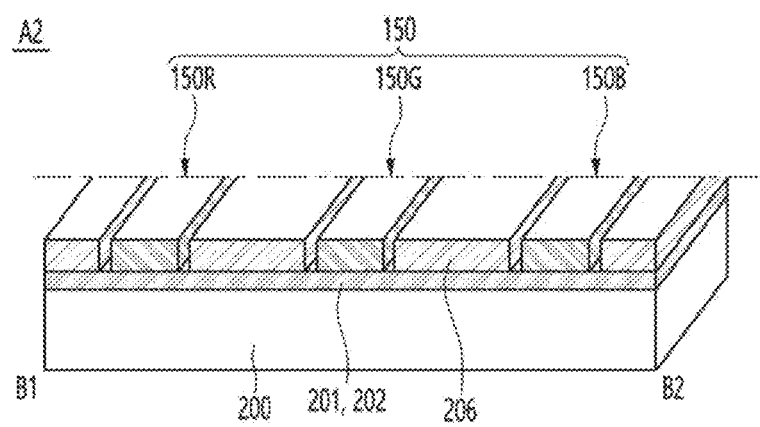

[FIG. 7]
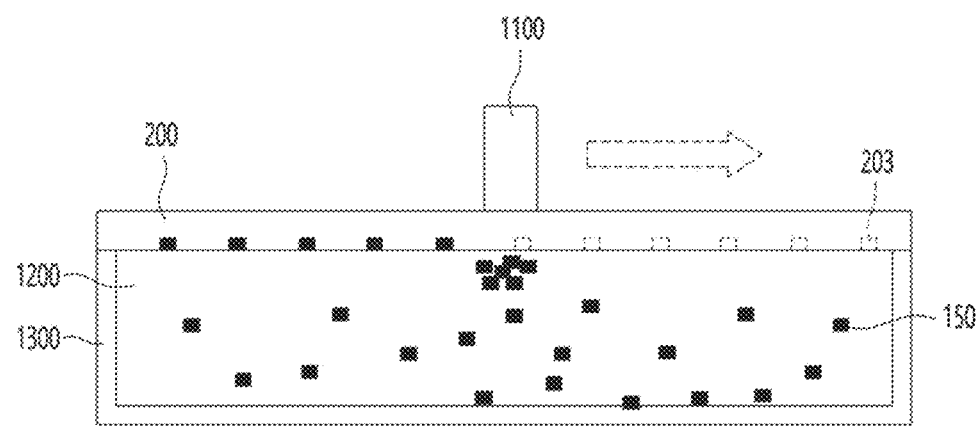
[FIG. 8]
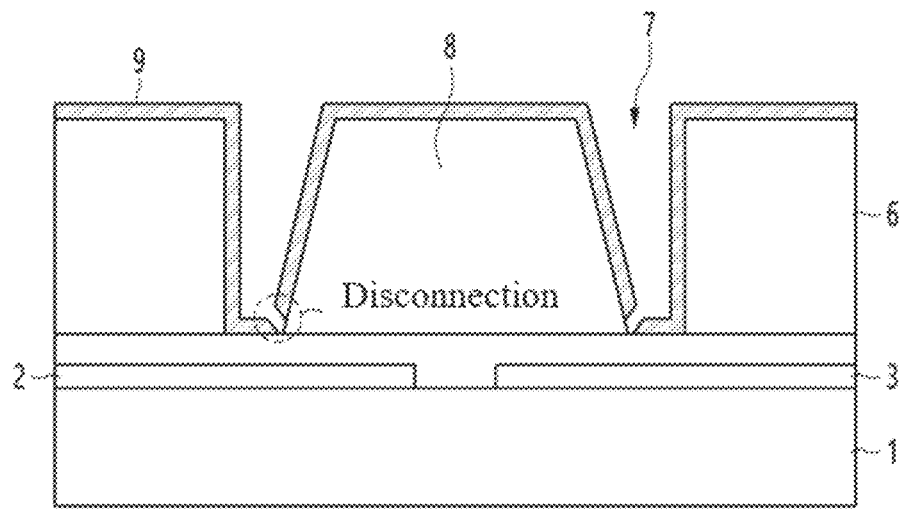

[FIG. 9]
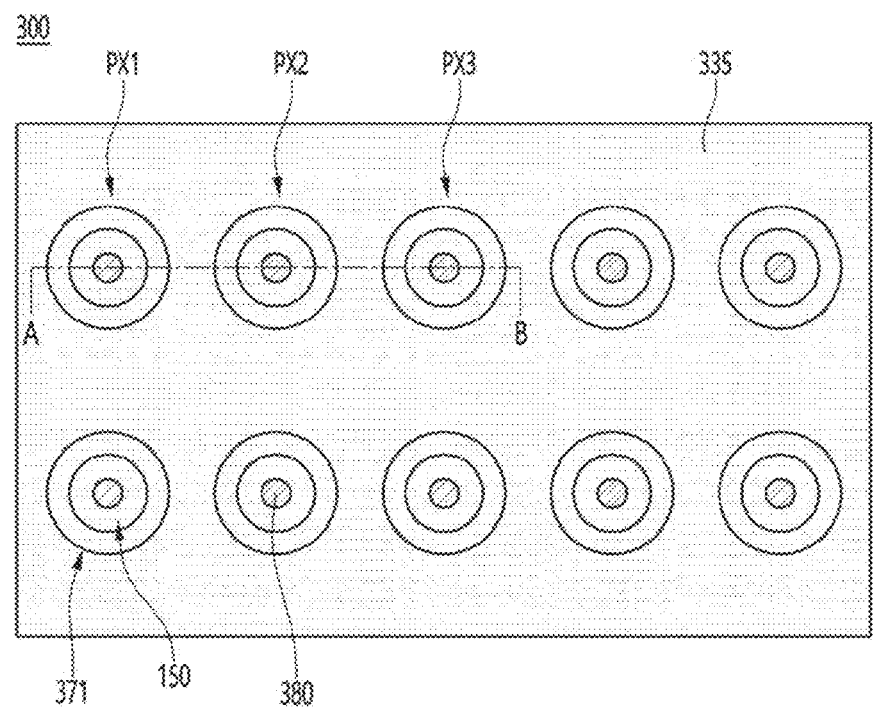
[FIG. 10]
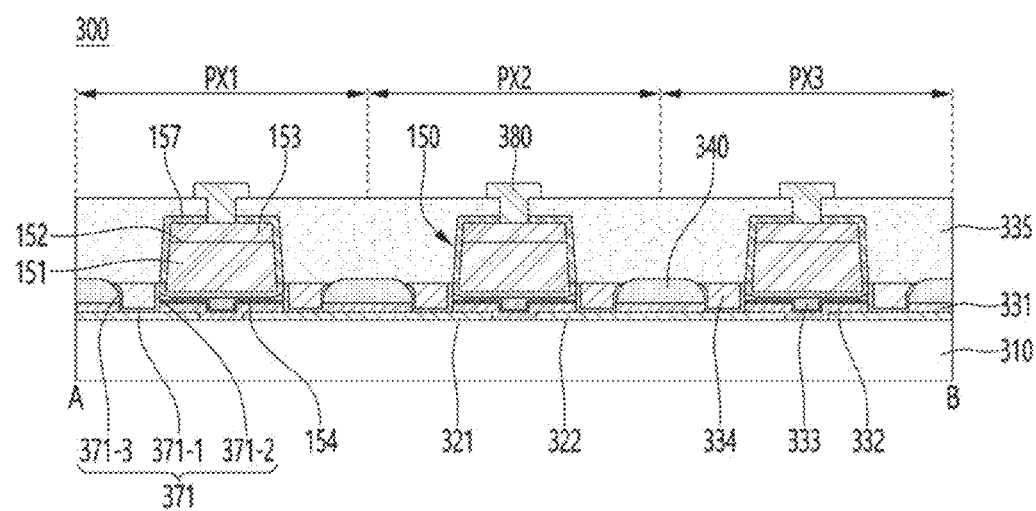

[FIG. 11]
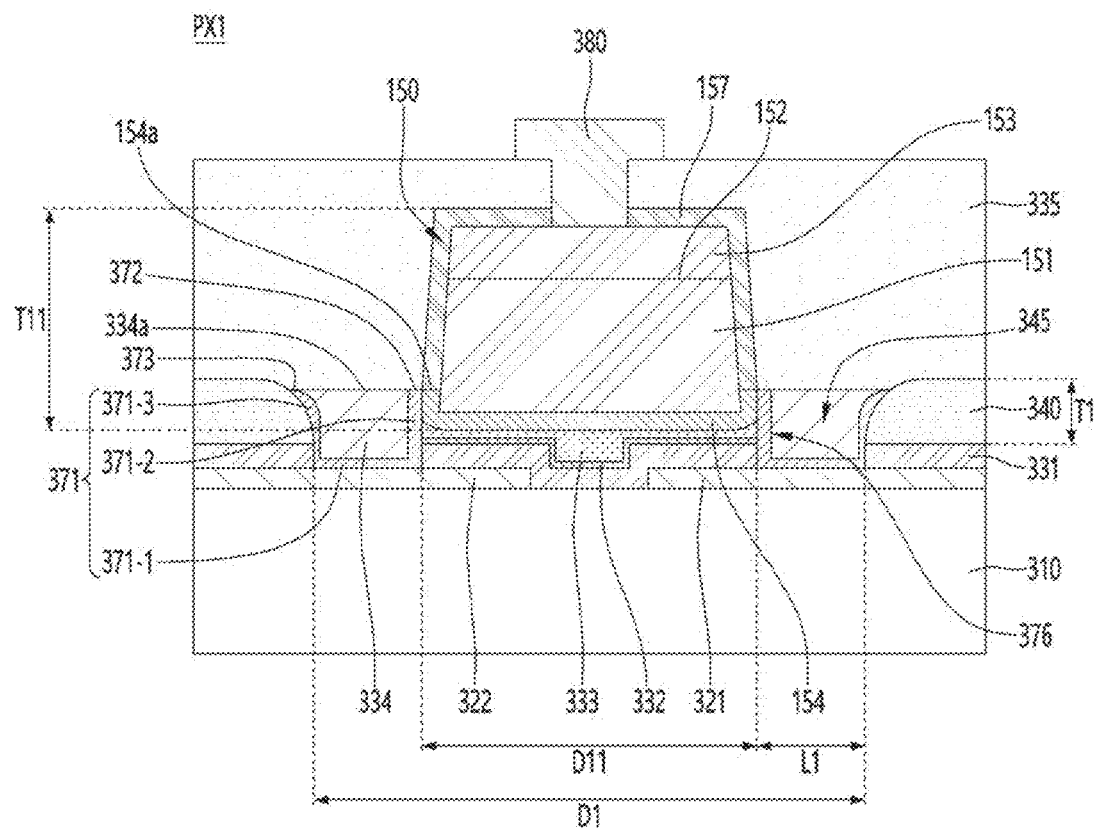

[FIG. 12]
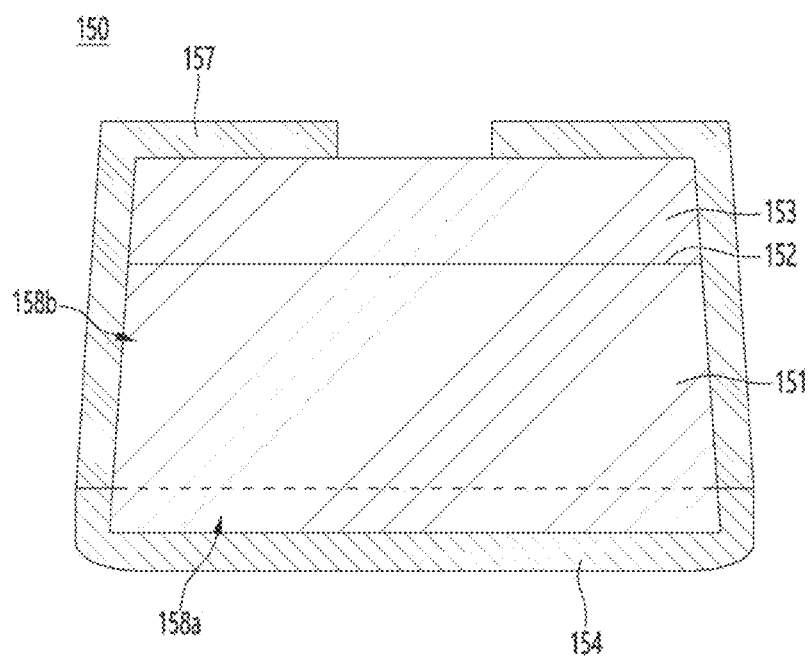

[FIG. 13]
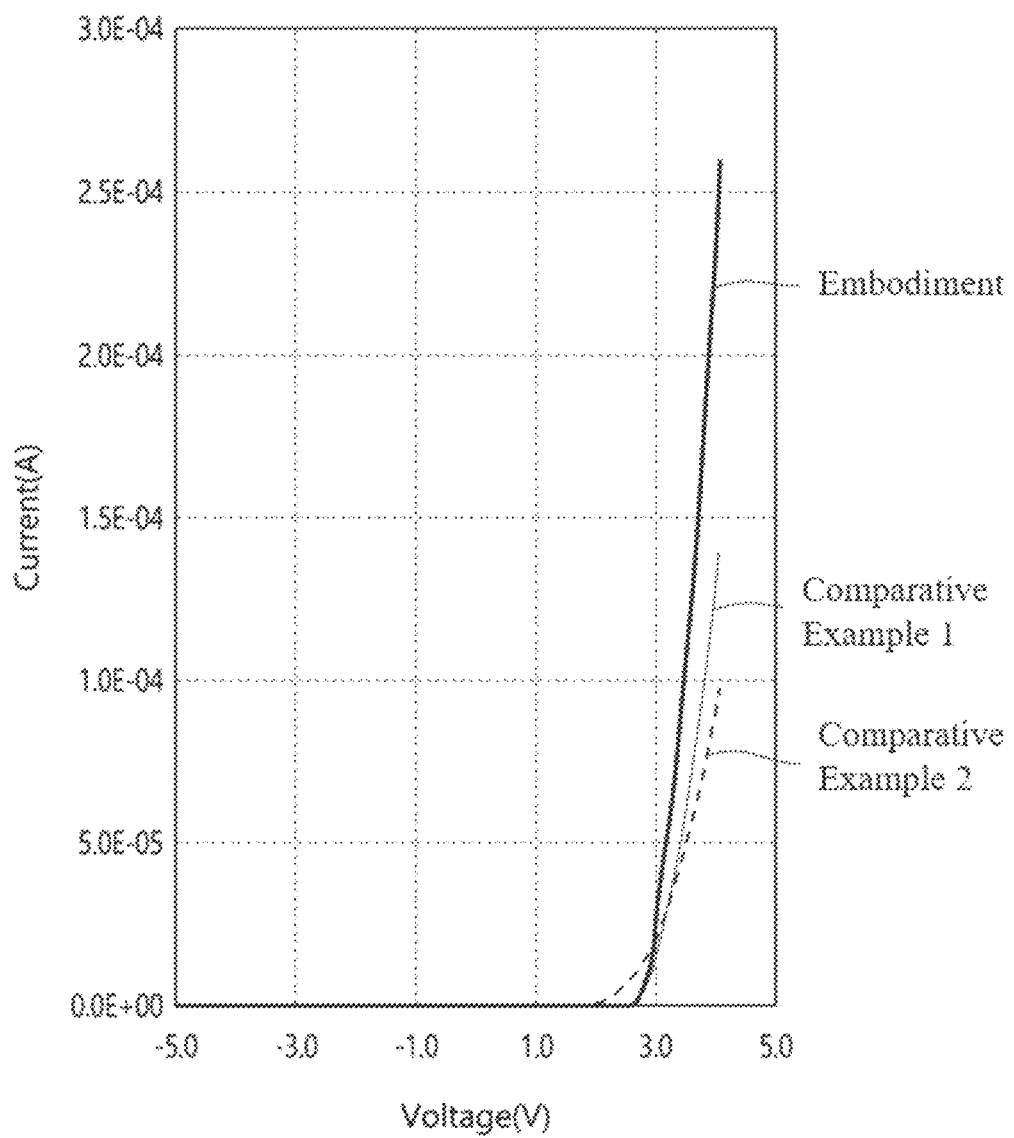

[FIG. 14A]
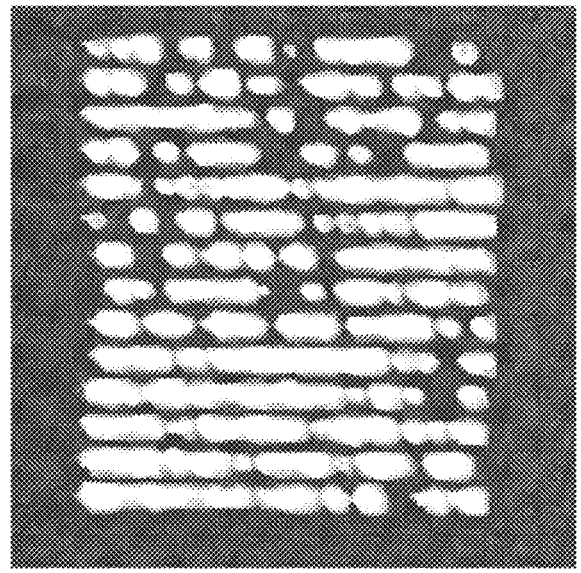
[FIG. 14B]
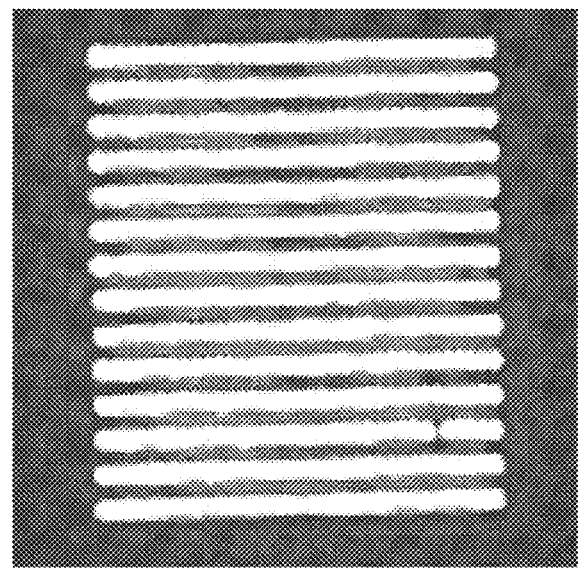

[FIG. 15]
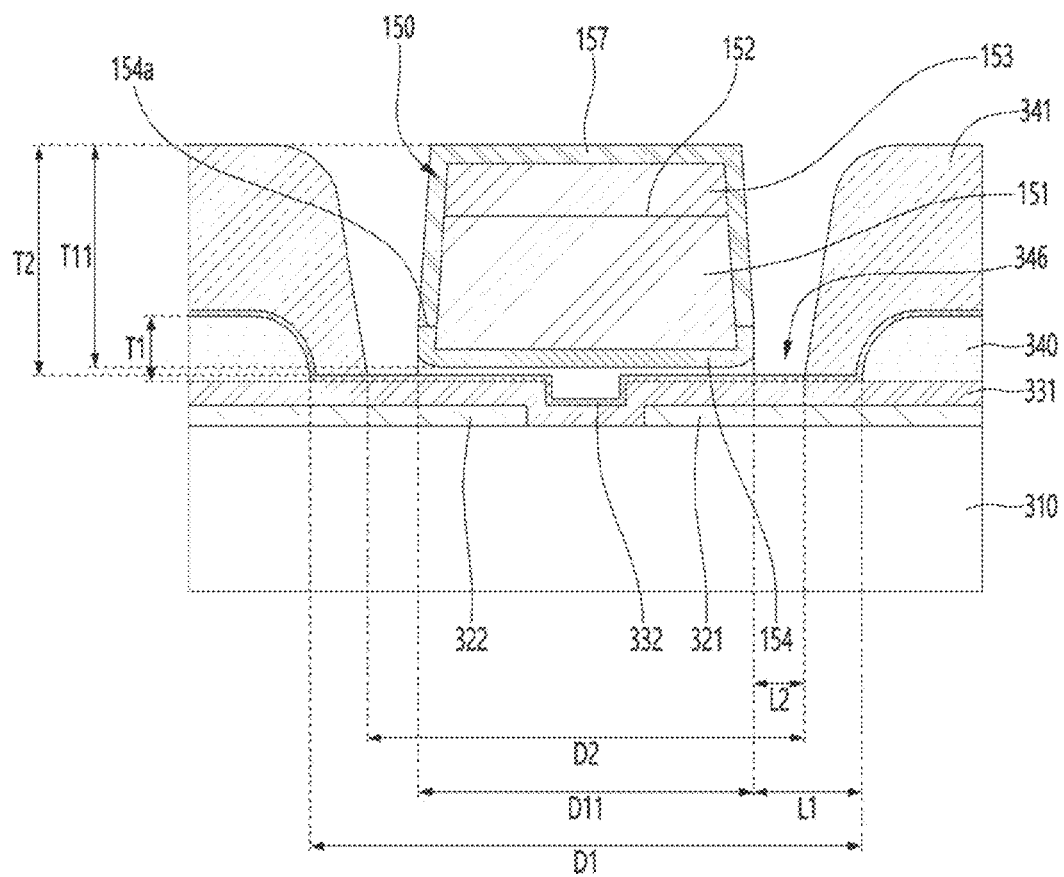

[FIG. 16]
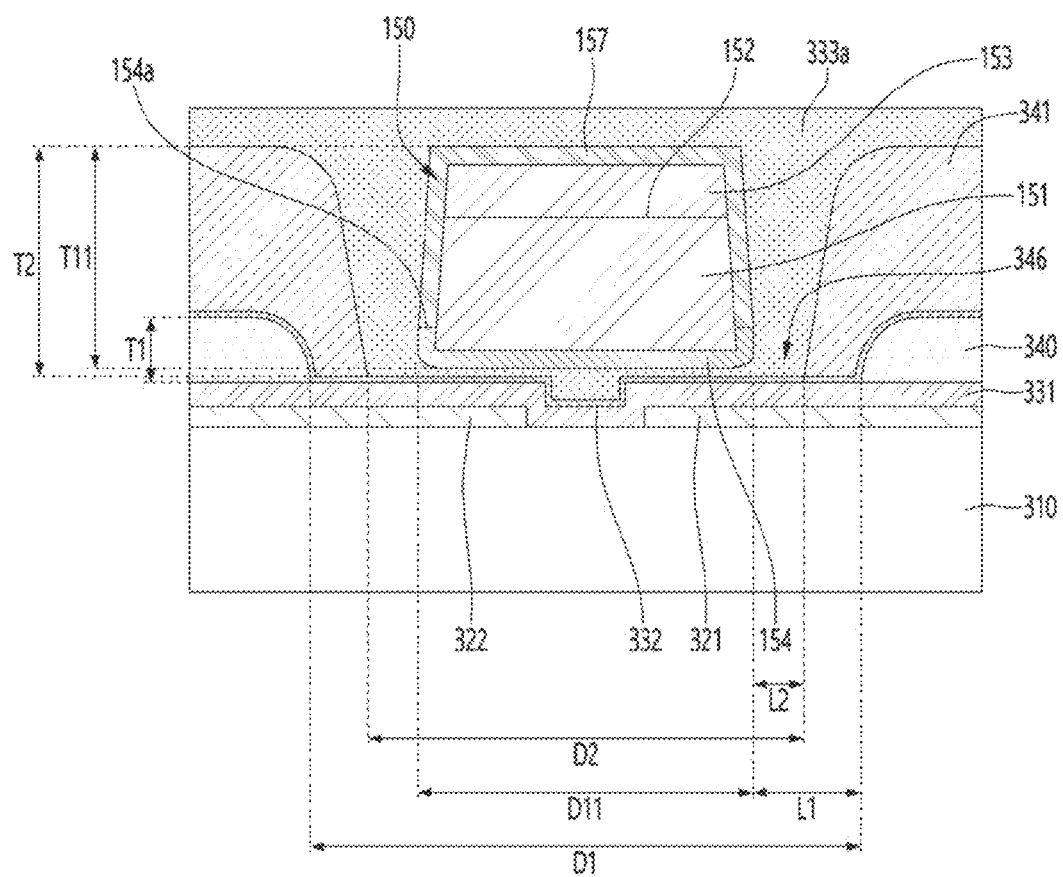

[FIG. 17]
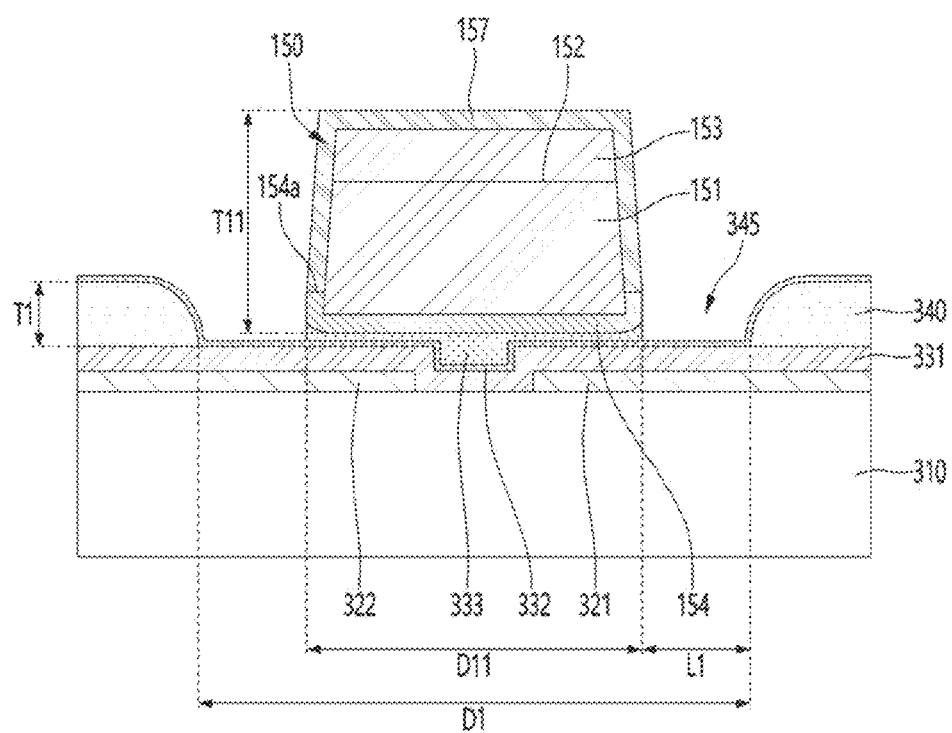

[FIG. 18]
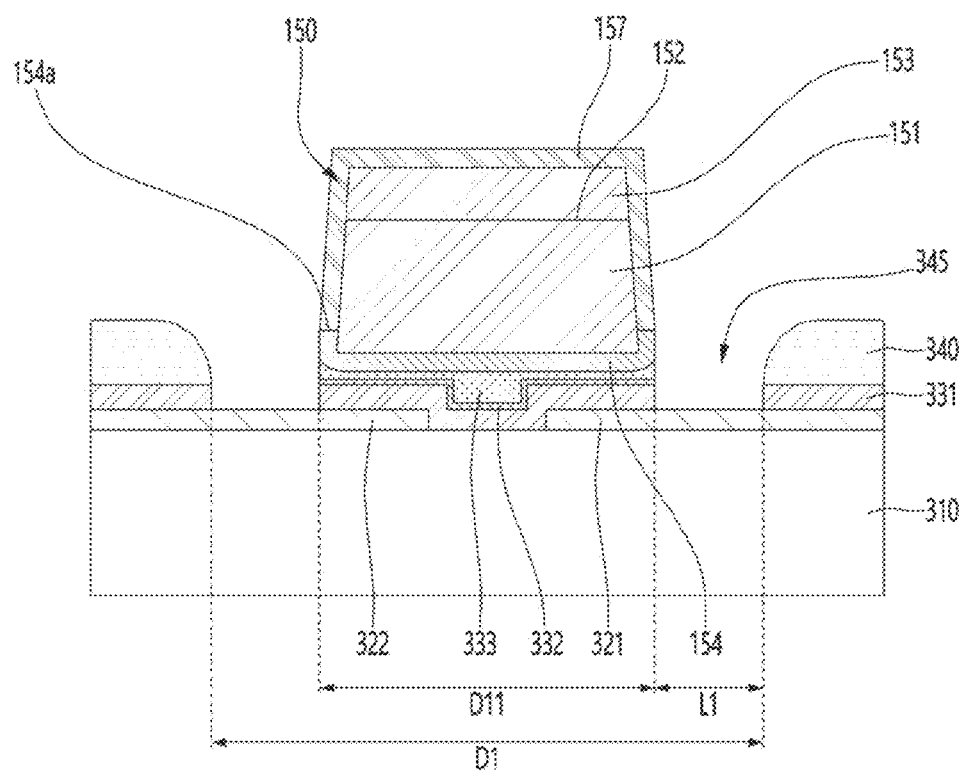

[FIG. 19]
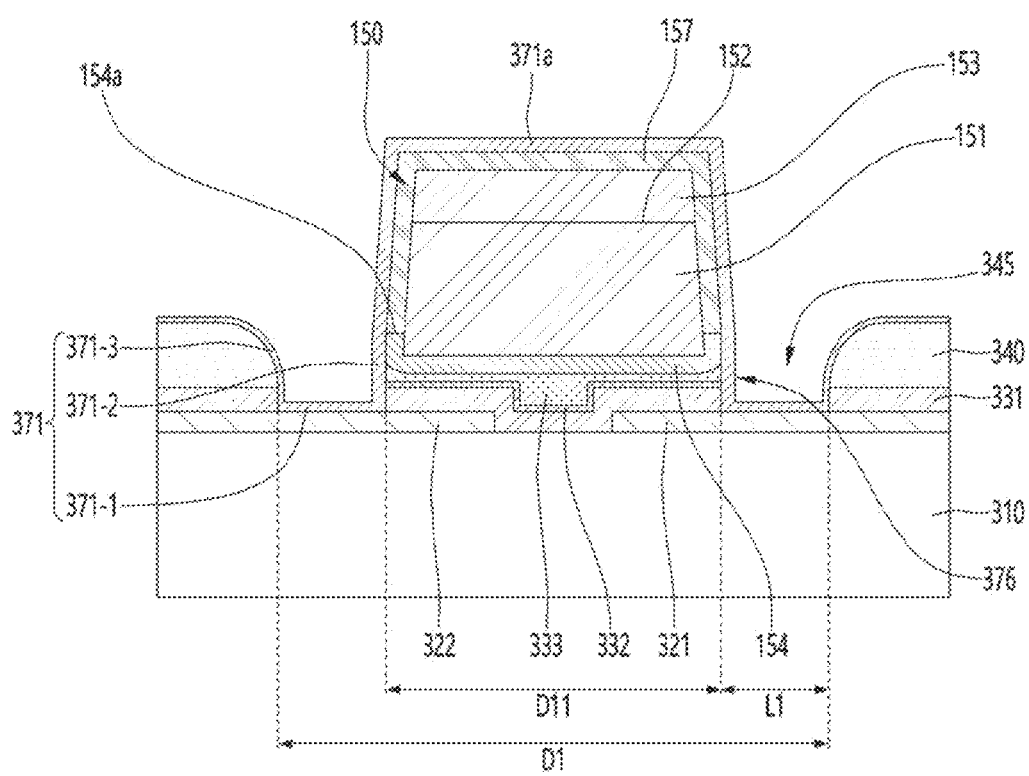

[FIG. 20]
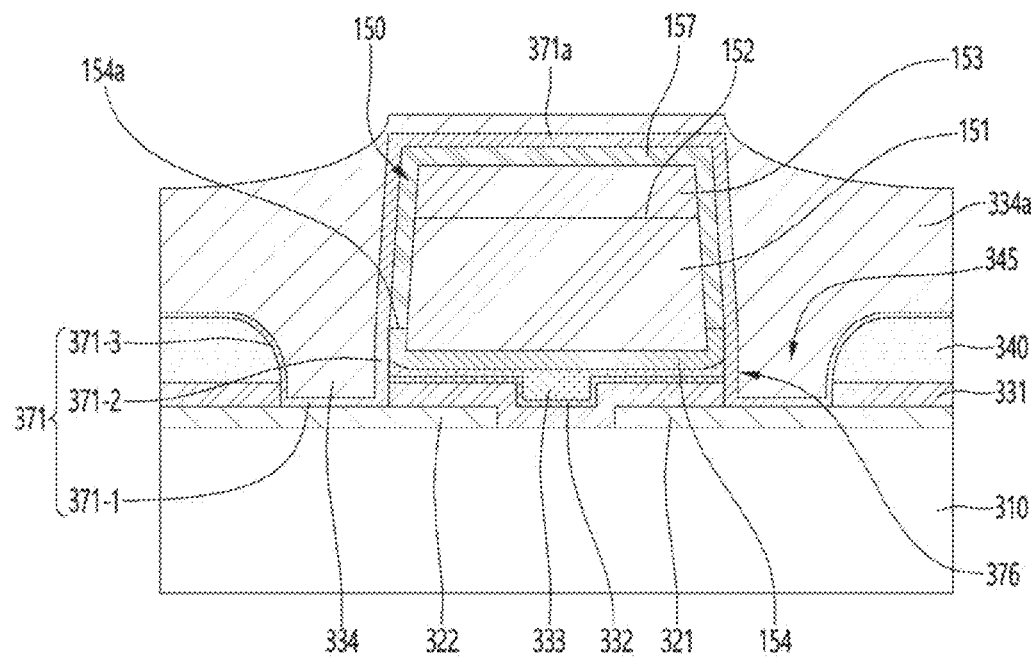

[FIG. 21]
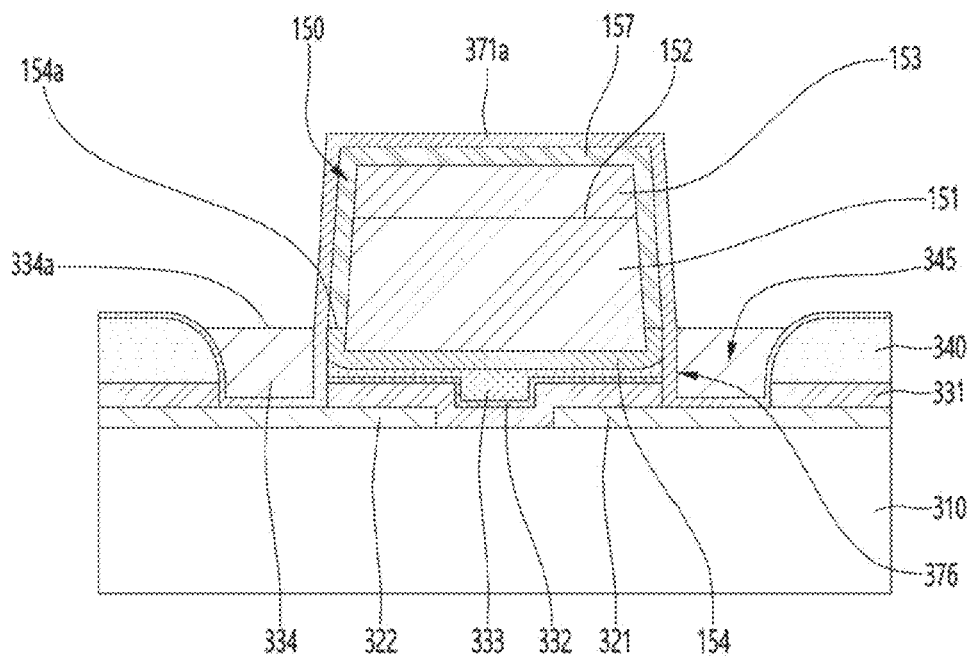
[FIG. 22]
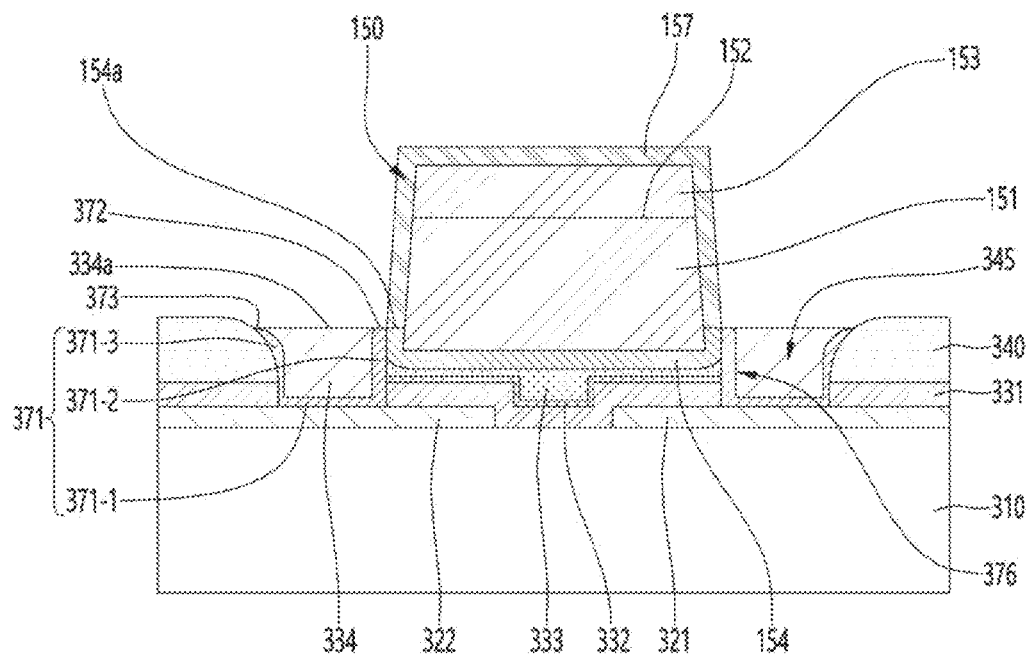

[FIG. 23]
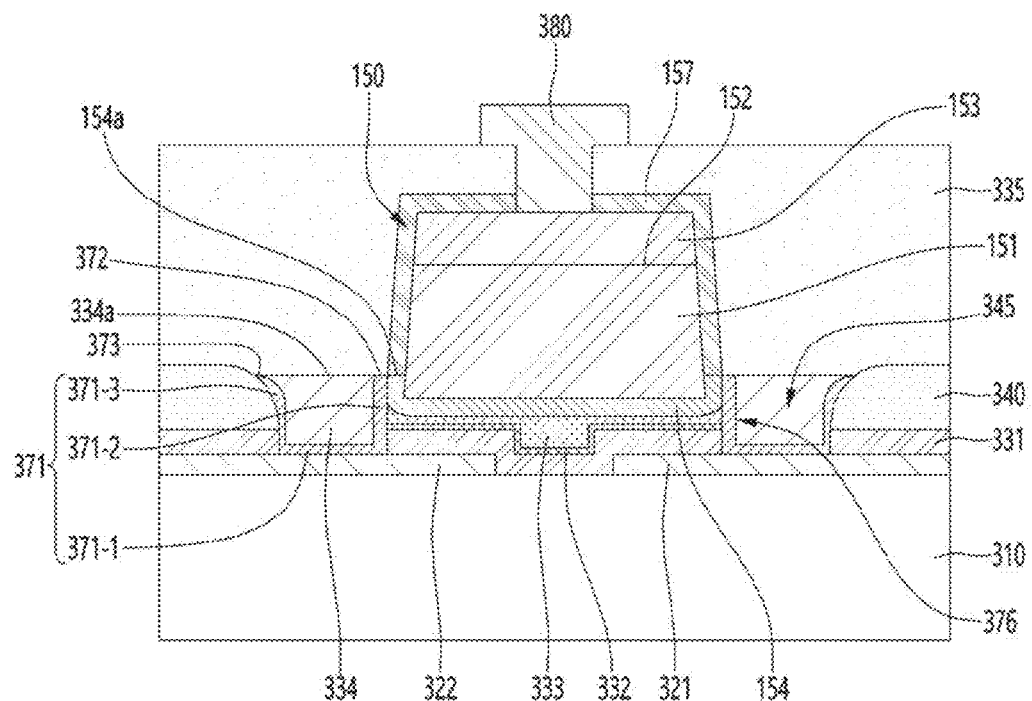

[FIG. 24]
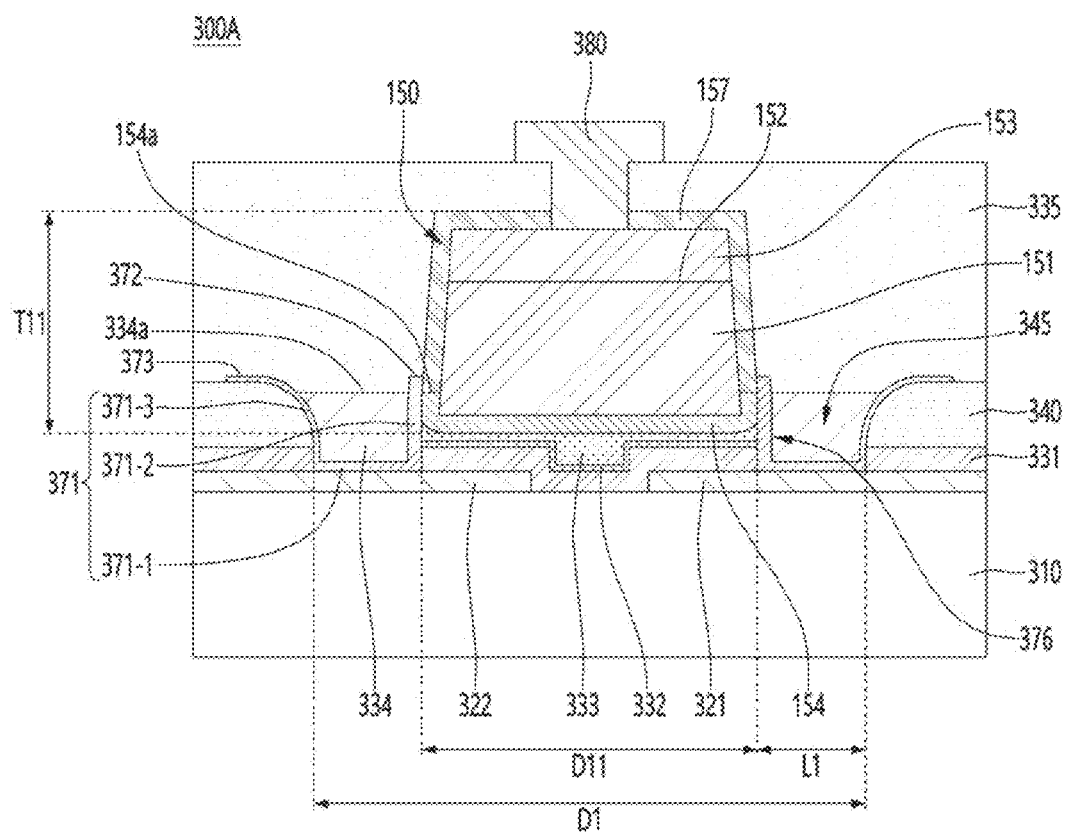

DISPLAY DEVICE

CROSS REFERENCE TO RELATED APPLICATIONS

This application is the National Phase of PCT International Application No. PCT/KR2021/015518, filed in the Republic of Korea on Nov. 1, 2021, all of which is hereby expressly incorporated by reference into the present application.

TECHNICAL FIELD

The embodiment relates to a display device.

BACKGROUND ART

Display devices display high-definition images using self-luminous elements such as light emitting diodes as light sources for pixels. Light emitting diodes exhibit excellent durability even under harsh environmental conditions and are capable of long lifespan and high brightness, so light emitting diodes are attracting attention as a light source for next-generation display devices.

Recently, ultra-small light emitting diodes have been manufactured using materials with a highly reliable inorganic crystal structure, research is underway to place this on the panel of a display device (hereinafter referred to as "display panel") and use it as a next-generation light source.

These display devices are expanding beyond flat displays into various forms such as flexible displays, foldable displays, stretchable displays, and rollable displays.

In order to realize high resolution, the size of the pixels is gradually becoming smaller, and the light emitting devices are to be aligned in numerous pixels of this smaller size, research into the manufacture of ultra-small light emitting diodes as small as micro or nano scale is being actively conducted.

Display devices typically contain tens of millions of pixels or more. Accordingly, because it is very difficult to align at least one light emitting device in each of tens of millions of small pixels, various studies on ways to align light emitting devices in a display panel are being actively conducted.

As the size of light emitting devices becomes smaller, quickly and accurately transferring these light emitting devices onto the substrate is becoming a very important problem to solve. Transfer technologies that have been recently developed include the pick and place process, laser lift-off method, or self-assembly method. In particular, the self-assembly method of transferring a light emitting device onto a substrate using a magnetic material (or magnet) has recently been in the spotlight.

In the self-assembly method, numerous light emitting devices are dropped into a mold containing a fluid, and as the magnetic material moves, the light emitting devices dropped into the fluid are moved to the pixels of the substrate, and the light emitting devices are aligned at each pixel. Therefore, the self-assembly method is attracting attention as a next-generation transfer method because it may quickly and accurately transfer numerous light emitting devices onto the substrate.

FIG. 1 is an exemplary diagram showing a conventional display device.

As shown in FIG. 1, first and second assembly wirings 2 and 3 and electrode wiring 4 are disposed on the substrate 1. In this case, after the light emitting device 8 is assembled in the assembly hole 7 of the barrier wall 6 using the first and second assembly wirings 2 and 3, the electrode wiring 4 is electrically connected to the lower side of the light emitting device 8.

Recently, the gap between the first assembly wiring 2 and the second assembly wiring 3 is decreasing for increasingly high-resolution displays. Accordingly, there is no space margin for arranging the electrode wiring 4 between the first assembled wire 2 and the second assembled wire 3, so the electrode wiring 4 cannot be placed any more. Accordingly, the development of a new electrode wiring structure is urgent.

Meanwhile, a bonding electrode is disposed on the lower side of the light emitting device 8 and is electrically connected to the electrode wiring 4 using a bonding process.

Due to limitations in high-temperature processes, bonding electrodes are made with low-melting point solder. However, solder has weak adhesion, so there is a problem that the light emitting device 8 may come off.

In addition, there is a problem that the bonding electrode does not maintain a uniform thickness during the bonding process, causing the light emitting device 8 to tilt and causing poor lighting due to poor contact with the electrode wiring 4.

DISCLOSURE

Technical Problem

The embodiment aims to solve the above-mentioned problems and other problems.

Another object of the embodiment is to provide a display device that presents a new electrical connection structure.

Another object of the embodiment is to provide a display device that can improve the lighting rate.

Another object of the embodiment is to provide a display device that can improve assembly defects.

The technical objects of the embodiments are not limited to those described in this item and include those that can be understood through the description of the invention.

Technical Solution

According to one aspect of the embodiment to achieve the above or other objects, a display device may include substrate; first and second assembly lines on the substrate, a first insulating layer on the first and second assembly lines, a barrier wall having a hole on the first insulating layer, a semiconductor light emitting device in the hole, and a connection part electrically connecting a side of the semiconductor light emitting device and at least one assembly wiring of the first and second assembly wirings, and the gap between the inner surface of the hole and the outer surface of the semiconductor light emitting device may be 50% to 200% of the thickness of the semiconductor light emitting device.

The display device may include a second insulating layer between the first insulating layer and the semiconductor light emitting device. The second insulating layer may be a stopper.

The display device may include a third insulating layer between the second insulating layer and the semiconductor light emitting device. The third insulating layer may include an adhesive layer.

The connection part may be arranged along the perimeter of the semiconductor light emitting device within the hole.

The semiconductor light emitting device may include a light emitting unit including a first region and a second region on the first region; a first electrode at least around a side surface of the first area of the light emitting unit; and a passivation layer around a side surface of the second area of the light emitting unit.

The connection part may include a groove, and the groove may include a fourth insulating layer.

The display device may include a fifth insulating layer on the semiconductor light emitting device and the barrier wall, and an electrode wiring electrically connected to the top of the semiconductor light emitting device through the fifth insulating layer.

Advantageous Effects

The embodiment may have a double barrier wall (340, 341) structure, as shown in FIG. 15. For example, the barrier wall 340 may have a thickness T1. The barrier wall 340 may include a hole (345 in FIG. 11) having a diameter D1. The second barrier wall 341 may have a second thickness T2 greater than the thickness T1 of the barrier wall 340. The second barrier wall 341 may include a second hole 346 having a second diameter D2 that is larger than the diameter D1 of the barrier wall 340.

During self-assembly, the semiconductor light emitting device 150 is assembled into the second hole 346 having a relatively small second diameter D2, so that the gap L2 between the outer side of the assembled semiconductor light emitting device 150 and the inner side of the second hole 346 of the second barrier wall 341 may be narrow. In this case, the semiconductor light emitting device 150 assembled in the second hole 346 of the second barrier wall 341 may not be separated from the second hole 346.

Additionally, as shown in FIGS. 16 to 21, by removing the second barrier wall 341, the gap L1 between the outer side of the semiconductor light emitting device 150 and the inner side of the hole 345 is widened by the hole 345 of the barrier wall 340, when the metal film 371a is increased, disconnection may not occur. Accordingly, as shown in FIG. 22, the semiconductor light emitting device 150 and at least one of the first assembly wiring 321 or the second assembly wiring 322 may be electrically connected to each other by the connection part 371 without disconnection.

In particular, the embodiment allows side connection of the semiconductor light emitting device 150 through the connection part 371, so that stable electrical connection is possible without disconnection even if the size of the semiconductor light emitting device 150 is reduced.

In addition, the embodiment is as shown in FIGS. 16 and 17, by patterning the photosensitive film 333a, which may be cured by light, the third insulating layer 334 is disposed between the semiconductor light emitting device 150 and the second insulating layer 332, the semiconductor light emitting device 150 may be stably attached to the second insulating layer 332 by the third insulating layer 334.

In addition, in the embodiment, the connection part 371 is disposed along the side perimeter of the semiconductor light emitting device 150, brightness may be improved by maximizing the contact area between the semiconductor light emitting device 150 and the connection part 371, and brightness uniformity between sub-pixels (PX1, PX2, and PX3) may be secured.

Additional scope of applicability of the embodiments will become apparent from the detailed description below. However, since various changes and modifications within the spirit and scope of the embodiments may be clearly understood by those skilled in the art, the detailed description and specific embodiments, such as preferred embodiments are to be understood as being given by way of example only.

DESCRIPTION OF DRAWINGS

FIG. 1 shows a conventional display device.

FIG. 2 shows a living room of a house where a display device according to an embodiment is placed.

FIG. 3 is a block diagram schematically showing a display device according to an embodiment.

FIG. 4 is a circuit diagram showing an example of the pixel of FIG. 3.

FIG. 5 is an enlarged view of the first panel area in the display device of FIG. 2.

FIG. 6 is an enlarged view of area A2 in FIG. 5.

FIG. 7 is a diagram showing an example in which a light emitting device according to an embodiment is assembled on a substrate by a self-assembly method.

FIG. 8 shows a display device according to the applicant's unpublished technology.

FIG. 9 is a plan view showing a display device according to the first embodiment.

FIG. 10 is a cross-sectional view showing a display device according to the first embodiment.

FIG. 11 is a cross-sectional view showing the first sub-pixel of FIG. 10.

FIG. 12 is a cross-sectional view showing the semiconductor light emitting device of FIG. 10.

FIG. 13 is a graph showing the electrical characteristics of comparative examples and embodiment.

FIGS. 14A and 14B show lighting states of comparative examples and embodiment.

FIGS. 15 to 23 show a method of manufacturing a display device according to the first embodiment.

FIG. 24 is a cross-sectional view showing a display device according to a second embodiment.

The size, shape, and dimensions of components shown in the drawings may be different from the actual ones. In addition, although the same components are shown in different sizes, shapes, and numbers between drawings, this is only an example in the drawings, identical components may have the same size, shape, and numerical value between drawings.

MODE FOR INVENTION

Hereinafter, embodiments disclosed in the present specification will be described in detail with reference to the attached drawings, but identical or similar components will be assigned the same reference numbers regardless of the reference numerals, and duplicate descriptions thereof will be omitted. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, region or substrate is referred to as being 'on' another component, this includes either directly on the other element or there may be other intermediate elements in between.

The display device described in this specification may include a TV, Shiny, a mobile phone, a smart phone, a head-up display (HUD) for an automobile, a backlight unit for a laptop computer, a display for VR or AR, etc. However, the configuration according to the embodiment described in this specification may be applied to a device capable of displaying even if it is a new product type that is developed in the future.

Hereinafter, a light emitting device according to an embodiment and a display device including the same will be described.

FIG. 2 shows a living room of a house where a display device according to an embodiment is placed.

Referring to FIG. 2, the display device 100 of the embodiment may display the status of various electronic products such as a washing machine 101, a robot vacuum cleaner 102, and an air purifier 103 and may communicate with each electronic product based on IoT and control each electronic product based on the user's setting data.

The display device 100 according to the embodiment may include a flexible display manufactured on a thin and flexible substrate. Flexible displays may bend or curl like paper while maintaining the characteristics of existing flat displays.

In a flexible display, visual information may be implemented by independently controlling the light emission of unit pixels arranged in a matrix form. A unit pixel refers to the minimum unit for implementing one color. A unit pixel of a flexible display may be implemented by a light emitting device. In the embodiment, the light emitting device may be Micro-LED or Nano-LED, but is not limited thereto.

FIG. 3 is a block diagram schematically showing a display device according to an embodiment, and FIG. 4 is a circuit diagram showing an example of the pixel of FIG. 3.

Referring to FIGS. 3 and 4, a display device according to an embodiment may include a display panel 10, a driving circuit 20, a scan driver 30, and a power supply circuit 50.

The display device 100 of the embodiment may drive the light emitting device in an active matrix (AM, Active Matrix) method or a passive matrix (PM, Passive Matrix) method.

The driving circuit 20 may include a data driver 21 and a timing control unit 22.

The display panel 10 may be rectangular, but this is not limited. That is, the display panel 10 may be formed in a circular or oval shape. At least one side of the display panel 10 may be bent to a predetermined curvature.

The display panel 10 may be divided into a display area (DA) and a non-display area (NDA) disposed around the display area (DA). The display area DA is an area where pixels PX are formed to display an image. The display panel 10 may include data lines (D1 to Dm, m is an integer greater than 2), scan lines (S1 to Sn, n is an integer greater than 2) that intersect the data lines (D1 to Dm), high-potential voltage line (VDDL) supplied with high-potential voltage, low-potential voltage line (VSSL) supplied with low-potential voltage, and pixels (PX) connected to data lines (D1 to Dm) and scan lines (S1 to Sn)

Each of the pixels PX may include a first sub-pixel PX1, a second sub-pixel PX2, and a third sub-pixel PX3. The first sub-pixel (PX1) emits a first color light of a first main wavelength, the second sub-pixel PX2 may emit a second color light of a second main wavelength, and the third sub-pixel PX3 may emit a third color light of a third main wavelength. The first color light may be red light, the second color light may be green light, and the third color light may be blue light, but are not limited thereto. Additionally, in FIG. 3, it is illustrated that each of the pixels PX includes three sub-pixels, but the present invention is not limited thereto. That is, each pixel PX may include four or more sub-pixels.

Each of the first sub-pixel (PX1), the second sub-pixel (PX2), and the third sub-pixel (PX3) may be connected to at least one of the data lines (D1 to Dm), at least one of the scan lines (S1 to Sn) and the high potential voltage line (VDDL). As shown in FIG. 4, the first sub-pixel PX1 may include light emitting devices LD, a plurality of transistors for supplying current to the light emitting devices LD, and at least one capacitor Cst.

Although not shown in the drawing, each of the first sub-pixel PX1, the second sub-pixel PX2, and the third sub-pixel PX3 may include only one light emitting device LD and at least one capacitor Cst.

Each of the light emitting devices LD may be a semiconductor light emitting diode including a first electrode, a plurality of conductivity-type semiconductor layers, and a second electrode. Here, the first electrode may be an anode electrode and the second electrode may be a cathode electrode, but this is not limited.

The light emitting device LD may be one of a horizontal light emitting device, a flip chip type light emitting device, and a vertical light emitting device.

As shown in FIG. 4, the plurality of transistors may include a driving transistor (DT) that supplies current to the light emitting devices (LD) and a scan transistor (ST) that supplies a data voltage to the gate electrode of the driving transistor (DT). The driving transistor (DT) may include a gate electrode connected to the source electrode of the scan transistor (ST), a source electrode connected to the high potential voltage line (VDDL) to which a high potential voltage is applied, and a drain electrode connected to the first electrodes of the light emitting devices (LD). The scan transistor (ST) may include a gate electrode connected to a scan line (Sk, k is an integer satisfying 1≤k≤n), a source electrode connected to the gate electrode of the driving transistor (DT) and a drain electrode connected to the data line (Dj, j is an integer satisfying 1≤j≤m)

The capacitor Cst is formed between the gate electrode and the source electrode of the driving transistor DT. The storage capacitor (Cst) charges the difference between the gate voltage and source voltage of the driving transistor (DT).

The driving transistor (DT) and the scan transistor (ST) may be formed of a thin film transistor. In addition, in FIG. 4, the driving transistor (DT) and the scan transistor (ST) are mainly described as being formed of a P-type MOSFET (Metal Oxide Semiconductor Field Effect Transistor), but the present invention is not limited thereto. The driving transistor (DT) and scan transistor (ST) may be formed of an N-type MOSFET. In this case, the positions of the source and drain electrodes of the driving transistor (DT) and the scan transistor (ST) may be changed.

In addition, in FIG. 4, Although it is illustrated that each of the first sub-pixel (PX1), the second sub-pixel (PX2), and the third sub-pixel (PX3) includes one driving transistor (DT), 2T1C (2 Transistor-1 capacitor) having one scan transistor (ST) and one capacitor (Cst), but the present invention is not limited thereto. Each of the first sub-pixel (PX1), the second sub-pixel (PX2), and the third sub-pixel (PX3) may include a plurality of scan transistors (ST) and a plurality of capacitors (Cst).

Since the second sub-pixel (PX2) and the third sub-pixel (PX3) may be represented by substantially the same circuit diagram as the first sub-pixel (PX1), detailed descriptions thereof will be omitted.

The driving circuit 20 outputs signals and voltages for driving the display panel 10. For this purpose, the driving circuit 20 may include a data driver 21 and a timing controller 22.

The data driver 21 receives digital video data (DATA) and source control signal (DCS) from the timing control unit 22. The data driver 21 converts digital video data (DATA) into analog data voltages according to the source control signal (DCS) and supplies them to the data lines (D1 to Dm) of the display panel 10.

The timing control unit 22 receives digital video data (DATA) and timing signals from the host system. Timing signals may include a vertical sync signal, a horizontal sync signal, a data enable signal, and a dot clock. The host system may be an application processor in a smartphone or tablet PC, a monitor, or a system-on-chip in a TV.

The timing control unit 22 generates control signals to control the operation timing of the data driver 21 and the scan driver 30. The control signals may include a source control signal (DCS) for controlling the operation timing of the data driver 21 and a scan control signal (SCS) for controlling the operation timing of the scan driver 30.

The driving circuit 20 may be disposed in the non-display area (NDA) provided on one side of the display panel 10. The driving circuit 20 may be formed as an integrated circuit (IC) and mounted on the display panel 10 using a chip on glass (COG) method, a chip on plastic (COP) method, or an ultrasonic bonding method, but the present invention is not limited to this. For example, the driving circuit 20 may be mounted on a circuit board (not shown) rather than on the display panel 10.

The data driver 21 is mounted on the display panel 10 using a COG (chip on glass) method, a COP (chip on plastic) method, or an ultrasonic bonding method, and timing control unit 22 may be mounted on a circuit board.

The scan driver 30 receives a scan control signal (SCS) from the timing control unit 22. The scan driver 30 generates scan signals according to the scan control signal SCS and supplies them to the scan lines S1 to Sn of the display panel 10. The scan driver 30 may include a plurality of transistors and may be formed in the non-display area NDA of the display panel 10. Alternatively, the scan driver 30 may be formed as an integrated circuit, and in this case, it may be mounted on a gate flexible film attached to the other side of the display panel 10.

The circuit board may be attached to pads provided at one edge of the display panel 10 using an anisotropic conductive film. Because of this, the lead lines of the circuit board may be electrically connected to the pads. The circuit board may be a flexible printed circuit board, a printed circuit board, or a flexible film such as a chip on film. The circuit board may be bent toward the bottom of the display panel 10. Because of this, one side of the circuit board is attached to one edge of the display panel 10, and the other side is placed below the display panel 10 and may be connected to a system board on which the host system is mounted.

The power supply circuit 50 may generate voltages necessary for driving the display panel 10 from the main power supplied from the system board and supply them to the display panel 10. For example, the power supply circuit 50 generates a high potential voltage (VDD) and a low potential voltage (VSS) to drive the light emitting devices (LD) of the display panel 10 from the main power supply, so that may supply the high potential voltage line (VDDL) and the low potential voltage line (VSSL) of the display panel 10. Additionally, the power supply circuit 50 may generate and supply driving voltages for driving the driving circuit 20 and the scan driver 30 from the main power supply.

FIG. 5 is an enlarged view of the first panel area in the display device of FIG. 3.

Referring to FIG. 5, the display device 100 of the embodiment may be manufactured by mechanically and electrically connecting a plurality of panel areas, such as the first panel area A1, by tiling.

The first panel area A1 may include a plurality of semiconductor light emitting devices 150 arranged for each unit pixel (PX in FIG. 3).

For example, the unit pixel PX may include a first sub-pixel PX1, a second sub-pixel PX2, and a third sub-pixel PX3. For example, a plurality of red semiconductor light emitting devices 150R are disposed in the first sub-pixel PX1, a plurality of green semiconductor light emitting devices 150G may be disposed in the second sub-pixel PX2, and a plurality of blue semiconductor light emitting devices 150B may be disposed in the third sub-pixel PX3. The unit pixel PX may further include a fourth sub-pixel in which a semiconductor light emitting device is not disposed, but this is not limited.

FIG. 6 is an enlarged view of area A2 in FIG. 5.

Referring to FIG. 6, the display device 100 of the embodiment may include a substrate 200, assembly wiring 201 and 202, an insulating layer 206, and a plurality of semiconductor light emitting devices 150. More components may be included than this.

The assembly wiring may include a first assembly wiring 201 and a second assembly wiring 202 that are spaced apart from each other. The first assembly wiring 201 and the second assembly wiring 202 may be provided to generate dielectrophoretic force to assemble the semiconductor light emitting device 150. For example, the semiconductor light emitting device 150 may be one of a horizontal semiconductor light emitting device, a flip chip type semiconductor light emitting device, and a vertical semiconductor light emitting device.

The semiconductor light emitting device 150 may include a red semiconductor light emitting device 150, a green semiconductor light emitting device 150G, and a blue semiconductor light emitting device 150B0 to form a unit pixel (sub-pixel), but is not limited to this, and red and green colors may be implemented by using red phosphors and green phosphors, respectively.

The substrate 200 may be a support member that supports components placed on the substrate 200 or a protection member that protects the components.

The substrate 200 may be a rigid substrate or a flexible substrate. The substrate 200 may be formed of sapphire, glass, silicon, or polyimide. Additionally, the substrate 200 may include a flexible material such as PEN (Polyethylene Naphthalate) or PET (Polyethylene Terephthalate). Additionally, the substrate 200 may be a transparent material, but is not limited thereto.

The substrate 200 is a circuit in the sub-pixels (PX1, PX2, and PX3) shown in FIGS. 3 and 4, for example, the substrate 200 may be a backplane equipped with transistors (ST, DT), capacitors (Cst), signal wires, etc., but this is not limited.

The insulating layer 206 may include an insulating and flexible organic material such as polyimide, PAC, PEN, PET, polymer, etc., or an inorganic material such as silicon oxide ($SiO_2$) or silicon nitride series (SiNx). The insulating layer may be integrated with the substrate 200 to form one substrate.

The insulating layer 206 may be a conductive adhesive layer that has adhesiveness and conductivity, and the conductive adhesive layer may be flexible and enable a flexible function of the display device. For example, the insulating layer 206 may be an anisotropic conductive film (ACF) or a conductive adhesive layer such as an anisotropic conductive medium or a solution containing conductive particles. The conductive adhesive layer may be a layer that is electrically conductive in a direction perpendicular to the thickness, but electrically insulating in a direction horizontal to the thickness.

The insulating layer 206 may include an assembly hole 203 into which the semiconductor light emitting device 150 is inserted. Therefore, during self-assembly, the semiconductor light emitting device 150 may be easily inserted into the assembly hole 203 of the insulating layer 206. The assembly hole 203 may be called an insertion hole, a fixing hole, an alignment hole, etc.

The assembly hole 203 may be called a hole, groove, groove, recess, pocket, etc.

The assembly hole 203 may be different depending on the shape of the semiconductor light emitting device 150. For example, the red semiconductor light emitting device, the green semiconductor light emitting device, and the blue semiconductor light emitting device each have different shapes, and may have an assembly hole 203 having a shape corresponding to the shape of each of these semiconductor light emitting devices. For example, the assembly hole 203 may include a first assembly hole for assembling a red semiconductor light emitting device, a second assembly hole for assembling a green semiconductor light emitting device, and a third assembly hole for assembling a blue semiconductor light emitting device. For example, a red semiconductor light emitting device has a circular shape, the green semiconductor light emitting device may have a first oval shape with a first minor axis and a second major axis, and the blue semiconductor light emitting device may have a second oval shape with a second minor axis and a second major axis, but is not limited thereto. The second major axis of the oval shape of the blue semiconductor light emitting device may be greater than the second major axis of the oval shape of the green semiconductor light emitting device, and the second minor axis of the oval shape of the blue semiconductor light emitting device may be smaller than the first minor axis of the oval shape of the green semiconductor light emitting device.

Meanwhile, methods for mounting the semiconductor light emitting device 150 on the substrate 200 may include, for example, a self-assembly method (FIG. 7) and a transfer method.

FIG. 7 is a diagram showing an example in which a semiconductor light emitting device according to an embodiment is assembled on a substrate by a self-assembly method.

The self-assembly method of the semiconductor light emitting device will be described with reference to FIGS. 6 and 7.

The substrate 200 may be a panel substrate of a display device. In the following description, the substrate 200 will be described as a panel substrate of a display device, but the embodiment is not limited thereto.

The substrate 200 may be formed of glass or polyimide. Additionally, the substrate 200 may include a flexible material such as PEN (Polyethylene Naphthalate) or PET (Polyethylene Terephthalate). Additionally, the substrate 200 may be a transparent material, but is not limited thereto.

Referring to FIG. 7, the semiconductor light emitting device 150 may be introduced into the chamber 1300 filled with the fluid 1200. The fluid 1200 may be water such as ultrapure water, but is not limited thereto. The chamber may be called a water tank, container, vessel, etc.

After this, the substrate 200 may be placed on the chamber 1300. Depending on the embodiment, the substrate 200 may be introduced into the chamber 1300.

As shown in FIG. 6, a pair of assembly wirings 201 and 202 corresponding to each of the semiconductor light emitting devices 150 to be assembled may be disposed on the substrate 200.

The assembled wires 201 and 202 may be formed of transparent electrodes (ITO) or may contain a metal material with excellent electrical conductivity. For example, the assembled wires 201 and 202 may be formed of at least one of titanium (Ti), chromium (Cr), nickel (Ni), Aluminum (Al), platinum (Pt), gold (Au), tungsten (W), molybdenum (Mo) or an alloy thereof.

An electric field is formed in the assembly wiring (201, 202) by an externally supplied voltage, and a dielectrophoretic force may be formed between the assembly wiring (201, 202) by this electric field. The semiconductor light emitting device 150 may be fixed to the assembly hole 203 on the substrate 200 by this dielectrophoretic force.

The gap between the assembly wirings 201 and 202 is formed to be smaller than the width of the semiconductor light emitting device 150 and the width of the assembly hole 203, so that the assembly position of the semiconductor light emitting device 150 using an electric field may be fixed more precisely.

An insulating layer 206 is formed on the assembly wiring 201 and 202, so that the assembly wirings 201 and 202 may be protected from the fluid 1200 and leakage of current flowing through the assembly wirings 201 and 202 may be prevented. The insulating layer 206 may be formed as a single layer or multilayer of an inorganic insulator such as silica or alumina or an organic insulator.

Additionally, the insulating layer 206 may include an insulating and flexible material such as polyimide, PEN, PET, etc., and may be integrated with the substrate 200 to form one substrate.

The insulating layer 206 may be an adhesive insulating layer or a conductive adhesive layer with conductivity. The insulating layer 206 is flexible and may enable flexible functions of the display device.

The insulating layer 206 has a barrier wall, and the assembly hole 203 may be formed by this barrier wall. For example, when forming the substrate 200, a portion of the insulating layer 206 is removed, so that each of the semiconductor light emitting devices 150 may be assembled into the assembly hole 203 of the insulating layer 206.

An assembly hole 203 in which the semiconductor light emitting devices 150 are coupled is formed in the substrate 200, and the surface where the assembly hole 203 is formed may be in contact with the fluid 1200. The assembly hole 203 may guide the exact assembly position of the semiconductor light emitting device 150.

Meanwhile, the assembly hole 203 may have a shape and size corresponding to the shape of the semiconductor light emitting device 150 to be assembled at the corresponding location. Accordingly, it is possible to prevent other semiconductor light emitting devices from being assembled in the assembly hole 203 or from assembling a plurality of semiconductor light emitting devices.

Referring again to FIG. 7, after the substrate 200 is disposed, the assembly device 1100 including a magnetic material may move along the substrate 200. For example, a magnet or electromagnet may be used as a magnetic material. The assembly device 1100 may move while in contact with the substrate 200 in order to maximize the area to which the magnetic field is applied within the fluid 1200. Depending on the embodiment, the assembly device 1100 may include a plurality of magnetic materials or a magnetic material of a size corresponding to that of the substrate 200. In this case, the moving distance of the assembly device 1100 may be limited to within a predetermined range.

The semiconductor light emitting device 150 in the chamber 1300 may move toward the assembly device 1100 by the magnetic field generated by the assembly device 1100.

While moving toward the assembly device 1100, the semiconductor light emitting device 150 may enter the assembly hole 203 and come into contact with the substrate 200.

At this time, by the electric field applied by the assembly wiring (201, 202) formed on the substrate 200, the semiconductor light emitting device 150 in contact with the substrate 200 may be prevented from being separated by movement of the assembly device 1100.

In other words, the time required for each of the semiconductor light emitting devices 150 to be assembled on the substrate 200 may be drastically shortened by the self-assembly method using the electromagnetic field described above, so that large-area, high-pixel displays may be implemented more quickly and economically.

A predetermined solder layer (not shown) is further formed between the semiconductor light emitting device 150 assembled on the assembly hole 203 of the substrate 200 and the substrate 200, so that the bonding strength of the semiconductor light emitting device 150 may be improved.

Afterwards, electrode wiring (not shown) is connected to the semiconductor light emitting device 150 and power may be applied.

Next, although not shown, at least one insulating layer may be formed through a post-process. At least one insulating layer may be a transparent resin or a resin containing a reflective material or a scattering material.

Meanwhile, the embodiment may improve the assembly rate of the semiconductor light emitting device by using a double barrier wall structure. The embodiment uses a double barrier wall structure to enable stable electrical connection without disconnection along the side perimeter of the semiconductor light emitting device, thereby improving brightness and ensuring brightness uniformity.

Descriptions omitted below may be easily understood from FIGS. 2 to 7 and the description given above in relation to the corresponding drawings.

FIG. 8 shows a display device according to the applicant's unpublished technology.

As shown in FIG. 8, research is being developed to electrically connect the light emitting device 8 to the side instead of the bottom.

That is, the first and second assembly wirings 2 and 3 are disposed on the substrate 1, the light emitting device 8 is assembled into the assembly hole 7 of the barrier wall 6 using the first and second assembly wirings 2 and 3. Afterwards, a metal film 9 is deposited on the barrier wall 6, and the metal film 9 is etched to be electrically connected to the side of the light emitting device 8.

However, as shown in FIG. 8, the gap between the outer side of the light emitting device (8) and the inner side of the assembly hole (7) is too narrow, so the metal film 9 deposited between the outer side of the light emitting device 8 and the inner side of the assembly hole 7 is difficult to deposit stably, resulting in electrical disconnection. Such electrical disconnection has the problem of causing lighting defects.

To solve this problem, in order to widen the gap between the outer side of the light emitting device 8 and the inner side of the assembly hole 7, the assembly hole 7 is to be enlarged, which has the problem of running counter to high resolution. That is, in order to electrically connect the side of the light emitting device 8, the diameter of the assembly hole 7 is to be increased. However, if the diameter of the assembly hole 7 increases, the resolution may decrease.

Therefore, there is an urgent need to develop a new process or structure that realizes high resolution and facilitates electrical connection to the side of the light emitting device 8.

In order to solve the above-mentioned problems, the first and second embodiments are described in detail below.

First Embodiment

FIG. 9 is a plan view showing a display device according to the first embodiment. FIG. 10 is a cross-sectional view showing a display device according to the first embodiment. FIG. 11 is a cross-sectional view showing the first sub-pixel of FIG. 10.

Referring to FIGS. 9 to 11, the display device 300 according to the first embodiment may include a substrate 310, a first assembly wiring 321, a second assembly wiring 322, and a first insulating layer 331, a barrier wall 340, a semiconductor light emitting device 150, and a connection part 371.

The substrate 310 may be a support member that supports components placed on the substrate 310 or a protection member that protects the components.

A plurality of pixels are defined on the substrate 310, and each pixel may include a first sub-pixel (PX1), a second sub-pixel (PX2), and a third sub-pixel (PX3).

The first and second assembly wirings 321 and 322 may be disposed on the substrate 310. For example, it may be in contact with the first and second assembly wirings 321 and 322 and the top surface of the substrate 310, but this is not limited. For example, the first and second assembly wirings 321 and 322 may be disposed on the same layer. For example, the first and second assembly wirings 321 and 322 may be arranged parallel to each other. The first and second assembly wires 321 and 322 may serve to assemble the semiconductor light emitting device 150 into the hole 345 in a self-assembly method. That is, during self-assembly, an electric field is generated between the first assembly wiring 321 and the second assembly wiring 322 by the voltage supplied to the first and second assembly wiring 321 and 322, the moving semiconductor light emitting device 150 may be assembled in the hole 345 by the assembly device (1100 in FIG. 7) by the dielectrophoretic force formed by this electric field.

The first insulating layer 331 may be disposed on the substrate 310. For example, the first insulating layer 331 may be made of an inorganic material or an organic material. For example, the first insulating layer 331 may be made of a material having a dielectric constant related to the dielectrophoretic force. Accordingly, the dielectrophoretic force formed by the voltage applied to the first assembled wiring 321 and the second assembled wiring 322 may vary depending on the dielectric constant of the first insulating layer 331.

The barrier wall 340 may be disposed on the first insulating layer 331. The barrier wall 340 may have a plurality of holes 345 for assembling the semiconductor light emitting device 150. For example, the inner side and bottom surface of the hole 345 may be exposed to the outside. For example, at least one hole 345 may be provided in each of the first to third sub-pixels (PX1, PX2, and PX3).

The thickness T1 of the barrier wall 340 may be determined by considering the thickness T11 of the semiconductor light emitting device 150. For example, the thickness T1 of the barrier wall 340 may be smaller than the thickness T11 of the semiconductor light emitting device 150. Accordingly, the upper side of the semiconductor light emitting device 150 may be positioned higher than the upper surface of the barrier wall 340. That is, the upper side of the semiconductor light emitting device 150 may protrude upward from the upper surface of the barrier wall 340. For example, the thickness T1 of the barrier wall 340 may be 10% to 70% of the thickness T11 of the semiconductor light emitting device 150. When the thickness T1 of the barrier wall 340 is less than 10% of the thickness T11 of the semiconductor light emitting device 150, color mixing of light between the semiconductor light emitting devices 150 may occur. If the thickness T1 of the barrier wall 340 exceeds 70% of the thickness T11 of the semiconductor light emitting device 150, the depth in the hole 345 is deep, so an electrical disconnection may occur in the connection part 371.

As will be explained later, another barrier wall (hereinafter referred to as a second barrier wall 341 in FIG. 15) may be disposed on the barrier wall 340. At this time, the second diameter D2 of the second hole 346 of the second barrier wall 341 may be smaller than the diameter D1 of the hole 345 of the barrier wall 340. The second diameter D2 of the second hole 346 may be larger than the diameter D11 of the semiconductor light emitting device 150. The diameter D1 of the hole 345 may be 150% to 300% of the diameter D11 of the semiconductor light emitting device 150.

If the semiconductor light emitting device 150 is assembled into the hole 345 of the barrier wall 340, the distance between the outer side of the semiconductor light emitting device 150 and the inner side of the hole 345 of the barrier wall 340 is large, so the semiconductor light emitting device 150 assembled in the hole 345 may not be fixed and may flow due to fluid or may be separated from the hole 345. However, when the second barrier wall 341 is disposed on the barrier wall 340 and is reduced to the second diameter D2 by the second hole 346 of the second barrier wall 341, even if the semiconductor light emitting device 150 assembled into the second hole 346 is moved by fluid, it does not fall out of the second hole 346. That is, the semiconductor light emitting device 150 is stably fixed within the second hole 346 by the second hole 346 of the second barrier wall 341 and does not fall out of the second hole 346. Afterwards, the second barrier wall 341 is removed through a post-process, so that the diameter D1 may be increased from the second diameter D2 to the diameter D1 by the hole 345 of the barrier wall 340. Accordingly, by ensuring the gap L1 between the outer side of the semiconductor light emitting device 150 assembled in the hole 345 of the barrier wall 340 and the inner side of the hole 345 as much as possible, the connection part 371 may be formed stably without disconnection.

The semiconductor light emitting device 150 may be disposed in the hole 345. For example, the semiconductor light emitting device 150 may include a red semiconductor light emitting device disposed in the first sub-pixel PX1, a green semiconductor light emitting device disposed in the second sub-pixel PX2 and a blue semiconductor light emitting device disposed in the third sub-pixel PX3. A red semiconductor light emitting device may generate red light, a green semiconductor light emitting device may generate green light, and a blue semiconductor light emitting device may generate blue light. Accordingly, a color image may be displayed by red light emitted from the first sub-pixel PX1, green light emitted from the second sub-pixel PX2, and blue light emitted from the third sub-pixel PX3.

The semiconductor light emitting device 150 may be made of an inorganic semiconductor material. For example, the semiconductor light emitting device 150 may be made of a group 2-6 compound semiconductor material or a group 3-5 compound semiconductor material, but is not limited thereto.

As shown in FIG. 12, the semiconductor light emitting device 150 may include a first conductivity-type semiconductor layer 151 including a first conductivity-type dopant, an active layer 152, and a second conductivity-type semiconductor layer 153 including a second conductivity-type dopant. For example, the first conductivity-type dopant may be a p-type dopant, and the second conductivity-type dopant may be an n-type dopant, but this is not limited. The first conductivity-type semiconductor layer 151, the active layer 152, and the second conductivity-type semiconductor layer 153 may form a light emitting unit.

The semiconductor light emitting device 150 may include a passivation layer 157 disposed along the perimeter of the light emitting portions 151, 152, and 153 and a first electrode 154 disposed below the light emitting portion 151, 152, 153. For example, the first electrode 154 may include an ohmic layer, at least one electrode layer, an adhesive layer, a magnetic layer, or a bonding layer, etc.

In FIG. 12, a portion of the passivation layer 157 on the upper side of the light emitting portions 151, 152, and 153 is shown to be exposed to the outside.

Part of the passivation layer 157 may not be removed. As shown in FIG. 11, the semiconductor light emitting device 150 from which part of the passivation layer 157 is not removed is assembled on the substrate 310, and after the fifth insulating layer 335 is formed, a portion of the passivation layer 157 on the upper side of the light emitting portions 151, 152, and 153 is removed when a contact hole is formed in the fifth insulating layer 335, and may communicate with the contact hole of the fifth insulating layer 335.

Meanwhile, although not shown, the semiconductor light emitting device 150 may include a second electrode disposed above the light emitting units 151, 152, and 153. The second electrode may include an ohmic layer, a magnetic layer, a transparent conductive layer, etc.

Although FIG. 12 shows a vertical semiconductor light emitting device 150, the embodiment may be equally applied to a horizontal semiconductor light emitting device or a flip chip type semiconductor light emitting device.

In an embodiment, the end 154a of the first electrode 154 may be disposed on the side of the light emitting portions 151, 152, and 153. For example, the end 154a of the first electrode 154 may be disposed along the side perimeter of the light emitting units 151, 152, and 153. For example, the end 154a of the first electrode 154 may be disposed along the side perimeter of the first conductivity-type semiconductor layer 151. For example, the first electrode 154 may extend from the lower side to the side of the light emitting portions 151, 152, and 153.

Meanwhile, the light emitting units 151, 152, and 153 may include a first area 158a and a second area 158b. For example, the first region 158a may include a portion of the first conductivity-type semiconductor layer 151. For example, the second region 158b may include another part of the first conductivity-type semiconductor layer 151, the active layer 152, and the second conductivity-type semiconductor layer 153.

In this case, the first electrode 154 may be disposed around the side surface of the first area 158a of the light emitting portions 151, 152, and 153, and the passivation layer 157 may be disposed around the side surface of the second area 158b of the light emitting units 151, 152, and 153.

The connection part 371 may electrically connect the side of the semiconductor light emitting device 150 and at least one of the first and second assembly wirings 321 or 322. In this case, at least one of the first and second assembled wires 321 or 322 may be an electrode wiring. That is, at least one of the first and second assembly wirings 321 or 322 may supply voltage to the first electrode 154 of the semiconductor light emitting device 150 through the connection part 371.

The connection part 371 may be made of a metal with excellent electrical conductivity and deposition characteristics. For example, the connection part 371 may be made of one or more of Ti, Ni, Mo, MoTi, Cu, Cr, Al, etc. For example, the connection part 371 may be formed using a deposition process such as sputtering, but this is not limited.

As described above, the diameter D1 of the hole 345 of the barrier wall 340 is much wider than the diameter D11 of the semiconductor light emitting device 150. For example, the gap L1 between the inner side of the hole 345 and the outer side of the semiconductor light emitting device 150 may be 50% to 200% of the thickness T11 of the semiconductor light emitting device 150. For example, the semiconductor light emitting device 150 may have a thickness (T11) of 10 µm or less and a diameter (D11) of 50 µm or less, but this is not limited.

In this way, because the gap L1 between the inner side of the hole 345 of the barrier wall 340 and the outer side of the semiconductor light emitting device 150 is very wide, When metal is formed in the area between the inner side of the hole 345 of the barrier wall 340 and the outer side of the semiconductor light emitting device 150 through the deposition process, the connection part 371 may be formed stably without disconnection.

For example, the connection part 371 may be disposed along the perimeter of the semiconductor light emitting device 150 within the hole 345 of the barrier wall 340. Therefore, since the electrical connection between the connection part 371 and the semiconductor light emitting device 150 continues along the circumference of the semiconductor light emitting device 150, the contact area between the connection part 371 and the semiconductor light emitting device 150 may be maximized. Accordingly, through at least one assembly wiring of the first and second assembly wirings 321 or 322, as the supplied voltage is supplied to the first electrode 154 of the semiconductor light emitting device 150 along the circumference of the semiconductor light emitting device 150 through the connection part 371, due to smoother current flow, uniform luminance may be secured without luminance deviation between sub-pixels (PX1, PX2, and PX3).

The connection part 371 may include a first connection part 371-1, a second connection part (371-2), and a third connection part 371-3.

For example, the first connection part 371-1 may contact the upper surface of at least one of the first and second assembly wirings 321 or 322. For example, the second connection part 371-2 may extend from one side of the first connection part 371-1 and contact the side of the first electrode 154 of the semiconductor light emitting device 150. For example, the third connection part 371-3 may extend from the other side of the first connection part 371-1 and contact the inner side of the barrier wall 340, that is, the inner side of the hole 345.

Meanwhile, the connection part 371 may include a groove 376. That is, the groove 376 may be formed on the connection part 371. The groove 376 may have a dent shape, but is not limited thereto. The connection part 371 is formed on at least the assembly wiring among the first and second assembly wirings 321 and 322, the first electrode 154 of the semiconductor light emitting device 150, and the inner side of the barrier wall 340 by a deposition process, by being formed to a thin thickness, the groove 376 may be formed. That is, the groove 376 may be surrounded by the connection part 371 on the connection part 371.

As an example, the end 372 of the second connection part 371-2 and the end 154a of the first electrode 154 may be disposed on the same line. For example, the end 372 of the second connection part 371-2 and the end 154a of the first electrode 154 may be disposed on the same horizontal line. Accordingly, the connection part 371 comes into contact with at least one of the first and second assembly wirings 321 or 322, the first electrode 154 of the semiconductor light emitting device 150, and the barrier wall 340, the adhesion of the connection part (371) is strengthened, preventing detachment of the connection part (371) and improving reliability.

Meanwhile, the end 373 of the third connection part 371-3 may be positioned lower than the upper surface of the barrier wall 340. For example, the end 373 of the third connection part 371-3 may be formed only on the inner side of the barrier wall 340.

The barrier wall 340 may be a separation member, spacer, blocking member, dam, and bank that prevents short circuit of the connection part 371 formed in each of the adjacent sub-pixels (PX1, PX2, and PX3).

As another example, the end 373 of the third connection part 371-3 may be formed on the upper surface of the barrier wall 340. In this case, the third connection part 371-3 may be formed not only on the inside of the barrier wall 340 but also on the upper surface of the barrier wall 340. At this time, the third connection part 371-3 may be spaced apart from the third connection part 371-3 of the adjacent sub-pixels PX1, PX2, and PX3 on the upper surface of the barrier wall 340.

Meanwhile, the display device 300 according to the first embodiment may include a second insulating layer 332. For example, the second insulating layer 332 is formed between the first insulating layer 331 and the semiconductor light emitting device 150 and may be a stopper.

As will be explained later, if the barrier wall 340 and the second barrier wall (341 in FIG. 15) are made of the same material, for example, an organic material, the barrier wall 340 may also be removed when the second barrier wall 341 is removed. Accordingly, the second insulating layer 332 may be formed on the entire area of the substrate 310 to protect the barrier wall 340. That is, the second insulating layer 332 may be formed on the first insulating layer 331 within the hole 345 of the barrier wall 340 and may be formed on the barrier wall 340 in other areas. Therefore, even if the second barrier wall 341 is removed using an etching process, the barrier wall 340 is not removed due to the second insulating layer 332.

To this end, the second insulating layer 332 is a material that is not etched by the etchant for etching the second barrier wall 341, and may be made of, for example, an inorganic material. For example, the second insulating layer 332 may be made of SiOx, SiNx, SiON, etc. The second insulating layer 332 may be 10 nm to 100 nm, but is not limited thereto. When the second insulating layer 332 is less than 10 nm, when the second barrier wall 341 is removed, the etchant may penetrate the second insulating layer 332 and penetrate into the barrier wall 340, thereby removing the barrier wall 340 as well. When the second insulating layer 332 exceeds 100 nm, the thickness of the display device 300 may increase.

Meanwhile, the display device 300 according to the first embodiment may include a third insulating layer 333. The third insulating layer 333 may be disposed between the second insulating layer 332 and the semiconductor light emitting device 150.

The third insulating layer 333 may include an adhesive layer for adhering the semiconductor light emitting device 150 to the second insulating layer 332. For example, the third insulating layer 333 may be made of a photosensitive material such as photoresist.

As will be explained later, after the semiconductor light emitting device 150 is assembled, a photosensitive material may be applied on the substrate 310. In this case, a photosensitive film made of a photosensitive material may be formed between the second insulating layer 332 and the semiconductor light emitting device 150. As the photosensitive film is cured by light irradiation, a third insulating layer 333 is formed between the semiconductor light emitting device 150 and the second insulating layer 332, so that the semiconductor light emitting device 150 may be adhered to the second insulating layer 332 by the third insulating layer 333.

When the semiconductor light emitting device 150 is firmly fixed to the second insulating layer 332 after being assembled, the third insulating layer 333 may be omitted.

Meanwhile, the display device 300 according to the first embodiment may include a fourth insulating layer 334. The fourth insulating layer 334 may be made of an organic material.

For example, the fourth insulating layer 334 may be disposed in the groove 376 formed on the connection part 371. In this case, the first connection part 371-1 may be disposed on the lower side of the fourth insulating layer 334, the second connection part 371-2 is disposed on the first side of the fourth insulating layer 334, and the third connection part 371-3 is disposed on the second side of the fourth insulating layer 334. It may be. In other words, the first connection part 371-1 may be disposed between the lower side of the fourth insulating layer 334 and at least one of the first and second assembly wirings 321 or 322. The second connection part 371-2 may be disposed between the first side of the fourth insulating layer 334 and the first electrode 154 of the semiconductor light emitting device 150. The third connection part 371-3 may be disposed between the second side of the fourth insulating layer 334 and the barrier wall 340.

For example, at least one end (372, 373) of the second connection part (371-2) and the third connection part (371-3) and the upper surface (334a) of the fourth insulating layer (334) may be disposed on the same line. As will be explained later, the position of at least one end (372, 373) of the second connection part (371-2) and the third connection part (371-3) may be determined by the upper surface (334a) of the fourth insulating layer (334). That is, the higher the upper surface 334a of the fourth insulating layer 334, the location of at least one end (372, 373) of the second connection part (371-2) and the third connection part (371-3) may increase from the top surface of the substrate 310.

The display device 300 according to the first embodiment may include a fifth insulating layer 335 and an electrode wiring 380. The fifth insulating layer 335 may be disposed on the semiconductor light emitting device 150 and the barrier wall 340. For example, the fifth insulating layer 335 may be made of an organic material.

For example, at least one of the first insulating layer 331, the fourth insulating layer 334, the fifth insulating layer 335, or the barrier wall 340 may be formed of the same type of organic material, but is not limited to this.

The electrode wiring 380 may be electrically connected to the upper part of the semiconductor light emitting device 150 through the fifth insulating layer 335. Therefore, through at least one of the first assembly wiring 321 or the second assembly wiring 322 and the connection part 371, a first voltage may be supplied to the lower side of the semiconductor light emitting device 150, that is, to the first electrode 154, and a second voltage may be supplied to the upper side of the semiconductor light emitting device 150 through the electrode wiring 380. Accordingly, current flows to the semiconductor light emitting device 150 due to the potential difference between the first voltage and the second voltage, electrons generated in the first conductivity-type semiconductor layer 151 and holes generated in the second conductivity-type semiconductor layer 153 recombine in the active layer 152 to generate light of a specific wavelength.

FIG. 13 is a graph showing the electrical characteristics of comparative examples and embodiment.

C 1 is an electrically connected structure using a bonding electrode such as solder, and comparative example 2 is an electrically connected structure where the thickness of the barrier wall is large, the embodiment is an electrical connection structure in which the thickness T1 of the barrier wall 340 is smaller than that of the barrier wall of comparative example 2 and the diameter D1 of the hole 345 is larger than that of the hole of comparative example 2.

As shown in FIG. 13, it may be seen that a larger current flows in the semiconductor light emitting device 150 of the example compared to comparative example 1 and comparative example 2 based on the same voltage. For example, when the same voltage, that is, 3.5V, is supplied to the semiconductor light emitting device 150 in each of comparative examples 1, 2, and Examples, while a current of approximately 5.0E-05A may flow in the semiconductor light emitting devices of comparative examples 1 and 2, a current of 1.0E-04A may flow in the semiconductor light emitting device 150 of the embodiment. Therefore, compared to comparative examples 1 and 2, a very high current flows in the semiconductor light emitting device 150 of the example, so that higher light output may be obtained and luminance may be improved. Additionally, compared to comparative examples 1 and 2, the semiconductor light emitting device 150 of the example requires a lower voltage to obtain the same luminance, thereby reducing power consumption.

FIGS. 14A and 14B show lighting states of comparative examples and embodiments.

The comparative example is a structure electrically connected using bonding electrodes such as solder, in the embodiment, the electrical connection structure is such that the thickness T1 of the barrier wall 340 is thin and the diameter D1 of the hole 345 is wide.

As shown in FIG. 14A, the lighting rate was 71.6% in comparison. On the other hand, as shown in FIG. 14B, in the embodiment, the lighting rate was 100%.

That is, as in the embodiment, the thickness T1 of the barrier wall 340 is thin and the diameter D1 of the hole 345 is wide, since the connection part 371 is electrically connected to the side of the semiconductor light emitting device 150 along the circumference of the semiconductor light emitting device 150, electrical connection defects may be prevented and a lighting rate of 100% may be achieved.

FIGS. 15 to 23 illustrate a method of manufacturing a display device according to the first embodiment.

As shown in FIG. 15, a substrate 310 may be provided. A first assembly wiring 321 and a second assembly wiring 322 may be disposed on the substrate 310. A first insulating layer 331 may be disposed on the first assembled wiring 321 and the second assembled wiring 322. A barrier wall 340 including a plurality of holes 345 may be disposed on the first insulating layer 331. A second insulating layer 332 may be disposed on the first insulating layer 331 and the barrier wall 340. The second barrier wall 341 may be disposed on the second insulating layer 332 corresponding to the barrier wall 340. The second barrier wall 341 may be disposed on the top and side surfaces of the barrier wall 340.

For example, the hole 345 of the barrier wall 340 may have a diameter D1, and the second hole 346 of the second barrier wall 341 may have a second diameter D2. At this time, the second diameter D2 of the second hole 346 of the second barrier wall 341 may be smaller than the diameter D1 of the hole 345 of the barrier wall 340.

The semiconductor light emitting device 150 may be assembled into the second hole 346 of the second barrier wall 341 using a self-assembly method as shown in FIG. 7. For example, the semiconductor light emitting device 150 may have a thickness of T11 and a diameter of D11. In this case, the thickness T2 (or height) of the second barrier wall 341 may be 80% to 130% of the thickness T11 of the semiconductor light emitting device 150. For example, the second diameter D2 of the second hole 346 of the second barrier wall 341 may be 100% to 130% of the diameter D11 of the semiconductor light emitting device 150. Accordingly, the second gap L2 between the inner side of the second hole 346 and the outer side of the semiconductor light emitting device 150 may be 0% to 15%.

Therefore, by making the second diameter D2 of the second hole 346 of the second barrier wall 341 slightly wider than the diameter D11 of the semiconductor light emitting device 150, the semiconductor light emitting device 150 may be stably assembled and fixed.

As shown in FIG. 16, a photosensitive film 333a may be formed by applying a photosensitive material on the substrate 310. For example, the photosensitive film 333a may be formed not only on the upper surface of the barrier wall 340 but also within the hole 345 of the barrier wall 340. In particular, since the photosensitive material is also applied between the semiconductor light emitting device 150 and the second insulating layer 332 within the hole 345 of the barrier wall 340, so a photosensitive film 333a may be formed between the semiconductor light emitting device 150 and the second insulating layer 332.

The semiconductor light emitting device 150 may be assembled and maintained on the second hole 346 by dielectrophoretic force even before the photosensitive film 333a is formed. At this time, since the semiconductor light emitting device 150 is maintained by the dielectrophoresis force, so that the semiconductor light emitting device 150 may be in contact with the bottom of the second hole 346, that is, the top surface of the second insulating layer 332, or may be positioned on it. For example, the second insulating layer 332 of the semiconductor light emitting device 150 may be spaced apart from the upper surface, thereby forming a space between the semiconductor light emitting device 150 and the second insulating layer 332.

When a photosensitive material is applied, the photosensitive material may be placed in the spaced space to form a photosensitive film 333a.

After forming the photosensitive film 333a, the photosensitive film 333a is cured by irradiating light, so that the semiconductor light emitting device 150 may be firmly adhered to the second insulating layer 332 by the photosensitive film 333a.

As shown in FIG. 17, the photosensitive film and the second barrier wall 341 may be removed using an etching process.

First, the photosensitive film may be removed. At this time, since the semiconductor light emitting device 150 serves as a mask, the photosensitive film between the semiconductor light emitting device 150 and the second insulating layer 332 is not removed and may become the third insulating layer 333. Accordingly, the semiconductor light emitting device 150 may be firmly adhered to the second insulating layer 332 by the third insulating layer 333. Afterwards, dry etching using O2 plasma may be performed to remove the second barrier wall 341. At this time, since the second insulating layer 332 is not removed by O2 plasma, the second plasma may be a stopper to protect the barrier wall 340.

As the second barrier wall 341 is removed, only the barrier wall 340 remains on the substrate 310. Since the thickness T1 of the barrier wall 340 is smaller than the thickness T2 of the second barrier wall 341, the barrier wall 340 may be lowered. Since the diameter D1 of the hole 345 of the barrier wall 340 is larger than the second diameter D2 of the second hole 346 of the second barrier wall 341, more holes 345 may be inserted. Accordingly, the gap L1 between the outer side of the semiconductor light emitting device 150 and the inner side of the hole 345 of the barrier wall 340 becomes larger, so that the connection part 371 is easily formed without disconnection in the subsequent process.

As shown in FIG. 18, by removing the second insulating layer 332 and the first insulating layer 331 between the inner side of the hole 345 and the semiconductor light emitting device 150 within the hole 345 of the barrier wall 340, at least one of the first assembly wiring 321 or the second assembly wiring 322 may be exposed to the outside.

As shown in FIG. 19, a metal may be deposited on the substrate 310 to form a metal film 371a. For example, a metal film 371a may be formed on the barrier wall 340. For example, a metal film 371a may be formed on the semiconductor light emitting device 150. For example, the metal film 371a may be formed in inner side of septum 340, that is, on at least one of the first assembly wiring 321 or the second assembly wiring 322 between the inner side of the hole 345 and the outer side of the semiconductor light emitting device 150.

For example, as the metal film 371a is formed with a very thin thickness of 10 nm to 100 nm, a groove 376 may be formed on the metal film 371a disposed between the inner side of the barrier wall 340 and the semiconductor light emitting device 150.

For example, the metal film 371a may be made of one or more of Ti, Ni, Mo, MoTi, Cu, Cr, Al, etc.

As shown in FIG. 20, an organic film 334a may be formed on the metal film 371a.

As shown in FIG. 21, an organic film 334a may be formed on the metal film 371a. Afterwards, the organic layer 334a may be removed. For example, by removing the organic layer 334a to expose the metal layer 371a on the barrier wall 340, the organic layer 334a may remain only in the groove 376 and form the fourth insulating layer 334.

As shown in FIG. 22, an etching process is performed using the fourth insulating layer 334 disposed in the groove 376 as a mask, so that except for the metal film 371a that is buried by the fourth insulating layer 334 and not exposed to the outside, the remaining metal films 371a may be removed. The metal film 371a that is buried by the fourth insulating layer 334 and is not removed may become a connection part 371.

Therefore, the fourth insulating layer 334 may be used as a mask to determine the height of the connection part 371. As the thickness of the fourth insulating layer 334 increases, the height of the metal film 371a buried by the fourth insulating layer 334 also increases, so the height of the connection part 371 may also be high. By adjusting the thickness of the fourth insulating layer 334, the end 372 of the second connection part 371-2 may be positioned on the side of the first electrode 154 of the semiconductor light emitting device 150.

As shown in FIG. 23, a fifth insulating layer 335 may be formed on the substrate 310, and a contact hole may be formed in the fifth insulating layer 335 to expose the upper side of the semiconductor light emitting device 150.

After the metal film 371a is formed on the fifth insulating layer 335, a pattern process may be performed to form an electrode wiring 380 electrically connected to the upper side of the semiconductor light emitting device 150 through a contact hole in the fifth insulating layer 335.

Second Embodiment

FIG. 24 is a cross-sectional view showing a display device according to a second embodiment.

The second embodiment is the same as the first embodiment except that the location of the connection part 371 is different. In the second embodiment, components having the same shape, structure, and/or function as those of the first embodiment are assigned the same reference numerals and detailed descriptions are omitted.

Referring to FIG. 24, the display device 300A according to the second embodiment include substrate 310, first assembly wiring 321, second assembly wiring 322, first insulating layer 331, barrier wall 340, semiconductor light emitting device 150 150 and connection part 371.

In the second embodiment, the location of the connection part 371 may be higher than that of the first embodiment. To this end, the thickness of the fourth insulating layer 334 may be thicker than that of the first embodiment. As described above, the location of the connection part 371 may be determined by the thickness of the fourth insulating layer 334. As the thickness of the fourth insulating layer 334 increases, the position of the connection part 371 may become higher.

In the first embodiment, the top surface 334a of the fourth insulating layer 334 may be disposed on the same line as the end 154a of the first electrode 154 of the semiconductor light emitting device 150. Accordingly, in the first embodiment, the end 372 of the second connection part 371-2 may also coincide with the end 154a of the first electrode 154 of the semiconductor light emitting device 150.

In contrast, in the second embodiment, the upper surface 334a of the fourth insulating layer 334 may be disposed on the passivation layer 157 on the side of the light emitting portions 151, 152, and 153 of the semiconductor light emitting device 150. In these cases, the end 372 of the second connection part 371-2 formed to the extent of the upper surface 334a of the fourth insulating layer 334 will be disposed on the passivation layer 157 on the side of the light emitting portions 151, 152, and 153. Additionally, the end 373 of the third connection part 371-3 may be disposed on the upper surface of the barrier wall 340. Therefore, since the connection part 371 contacts not only the first electrode 154 of the semiconductor light emitting device 150 but also the passivation layer 157, and contacts not only the inner side but also the top surface of the barrier wall 340, the adhesion of the connection part 371 may be further strengthened, thereby further improving reliability.

The above detailed description is not to be construed as restrictive in any respect and is to be considered illustrative. The scope of the embodiment is to be determined by reasonable interpretation of the appended claims, and all changes within the equivalent scope of the embodiment are included in the scope of the embodiment.

INDUSTRIAL APPLICABILITY

The embodiment may be adopted in the field of displays that display images or information. The embodiment may be adopted in a display field that displays images or information using a semiconductor light emitting device. The semiconductor light emitting device may be a micro-level semiconductor light emitting device or a nano-level semiconductor light emitting device.

For example, the embodiment may be adopted in TVs, signage, smart phones, mobile phones, mobile terminals, HUDs for automobiles, backlight units for laptops, and display devices for VR or AR.

The invention claimed is:

1. A display device comprising:
a substrate;
a first assembly wiring and a second assembly wiring on the substrate;
a first insulating layer on the first and second assembly wirings;
a barrier wall comprising a hole on the first insulating layer;
a semiconductor light emitting device in the hole;
a connection part configured to electrically connect a side of the semiconductor light emitting device and at least one of the first and second assembly wirings; and
a second insulating layer between the first insulating layer and the semiconductor light emitting device,
wherein the first assembly wiring and the second assembly wiring are spaced apart from the semiconductor light emitting device,
wherein the connection part is not vertically overlapped with the semiconductor light emitting device,
wherein both the first assembly wiring and the second assembly wiring are disposed lower than the semiconductor light emitting device,
wherein the connection part is disposed on a top surface of the at least one of the first assembly wiring and the second assembly wiring,
wherein the first insulating layer comprises a first portion on the first and second assembly wirings and a second portion disposed under the semiconductor light emitting device, and
wherein the second insulating layer is disposed under the semiconductor light emitting device and is disposed between the second portion of the first insulating layer and the semiconductor light emitting device.

2. The display device according to claim 1, wherein the connection part is disposed along a perimeter of the semiconductor light emitting device within the hole.

3. The display device according to claim 1, wherein the semiconductor light emitting device comprises a light emitting unit comprising a first area and a second area on the first area; a first electrode at least around a side surface of the first area of the light emitting unit; and a passivation layer around a side surface of the second area of the light emitting unit.

4. The display device according to claim 1, further comprising a third insulating layer on the semiconductor light emitting device and the barrier wall; and an electrode wiring electrically connected to an upper portion of the semiconductor light emitting device through the third insulating layer.

5. The display device according to claim 3, wherein the first electrode comprises an extended electrode on a side surface of the light emitting unit and the connection part that is in direct contact with the extended electrode.

6. The display device according to claim 1, wherein a length of the second insulating layer corresponds to a maximum length of the semiconductor light emitting device with respect to a horizontal direction.

7. The display device according to claim 1, wherein the first assembly wiring and the second assembly wiring are not vertically overlapped with each other.

8. The display device according to claim 1, wherein the first assembly wiring and the second assembly wiring are spaced apart from each other,
  wherein the first assembly wiring and the second assembly wiring are disposed horizontally at a same height, and
  wherein a spaced portion between the first assembly wiring and the second assembly wiring is vertically overlapped with the semiconductor light emitting device.

9. The display device according to claim 1, wherein the second portion of the first insulating layer is disposed between the first assembly wiring or the second assembly wiring.

10. The display device according to claim 1, wherein the connection part comprises:
  a first-first connection part on the first assembly wiring or the second assembly wiring; and
  a first-second connection part configured to extend from the first-first connection part and on a first side of the second insulating layer, and
  wherein a bottom surface of the first-first connection part is lower than a bottom surface of the second insulating layer.

11. The display device according to claim 1, wherein a portion of the first assembly wiring or the second assembly wiring is vertically overlapped with the semiconductor light emitting device.

12. The display device according to claim 1, wherein the semiconductor light emitting device comprises a first conductivity-type semiconductor layer, a second conductivity-type semiconductor layer and an active layer between the first conductivity-type semiconductor layer and the second conductivity-type semiconductor layer, and
  wherein both the first assembly wiring and the second assembly wiring are electrically connected the first conductivity-type semiconductor layer of the semiconductor light emitting device.

13. A display device comprising:
a substrate;
a first assembly wiring and a second assembly wiring on the substrate;
a first insulating layer on the first and second assembly wirings;
a barrier wall comprising a hole on the first insulating layer;
a semiconductor light emitting device in the hole;
a connection part configured to electrically connect a side of the semiconductor light emitting device and at least one of the first and second assembly wirings; and
a third insulating layer between a second insulating layer and the semiconductor light emitting device,
wherein the first assembly wiring and the second assembly wiring are spaced apart from the semiconductor light emitting device,
wherein the connection part is not vertically overlapped with the semiconductor light emitting device,
wherein both the first assembly wiring and the second assembly wiring are disposed lower than the semiconductor light emitting device,
wherein the connection part is disposed on a top surface of the at least one of the first assembly wiring and the second assembly wiring,
wherein the first insulating layer comprises a first portion on the first and second assembly wirings and a second portion disposed under the semiconductor light emitting device, and
wherein the second insulating layer is disposed under the semiconductor light emitting device and is disposed between the second portion of the first insulating layer and the semiconductor light emitting device.

14. A display device comprising:
a substrate;
a first assembly wiring and a second assembly wiring on the substrate;
a first insulating layer on the first and second assembly wirings;
a barrier wall comprising a hole on the first insulating layer;
a semiconductor light emitting device in the hole; and
a connection part configured to electrically connect a side of the semiconductor light emitting device and at least one of the first and second assembly wirings,
wherein a gap between an inner surface of the hole and an outer surface of the semiconductor light emitting device,
wherein the semiconductor light emitting device comprises a light emitting unit comprising a first area and a second area on the first area; a first electrode at least around a side surface of the first area of the light emitting unit; and a passivation layer around a side surface of the second area of the light emitting unit,
wherein the connection part comprises a groove and further comprising a second insulating layer in the groove,
wherein the first assembly wiring and the second assembly wiring are spaced apart from the semiconductor light emitting device,
wherein the connection part is not vertically overlapped with the semiconductor light emitting device,
wherein both the first assembly wiring and the second assembly wiring are disposed lower than the semiconductor light emitting device,
wherein the connection part is disposed on a top surface of the at least one of the first assembly wiring and the second assembly wiring, wherein the first insulating layer comprises a first portion on the first and second assembly wirings and a second portion disposed under the semiconductor light emitting device, and wherein the second insulating layer is disposed under the semiconductor light emitting device and is disposed between the second portion of the first insulating layer and the semiconductor light emitting device.

15. The display device according to claim 14, wherein the connection part comprises:
- a first-first connection part on a lower side of the second insulating layer;
- a first-second connection part configured to extend from the first-first connection part and on a first side of the second insulating layer; and
- a first-third connection part configured to extend from the first-first connection part and on a second side of the second insulating layer.

16. The display device according to claim 15, wherein the first-first connection part is in contact with at least one of the first and second assembly wiring, and wherein the first-second connection part is in contact with the first electrode.

17. The display device according to claim 15, wherein an end of the first-second connection part and an end of the first electrode are disposed on a same line.

18. The display device according to claim 15, wherein an end of the first-third connection part is in contact with an inner surface of the barrier wall and is disposed lower than a surface of the barrier wall.

19. The display device according to claim 15, wherein an end of at least one of the first-second connection part and the first-third connection part and an upper surface of the second insulating layer are disposed on a same line.

20. The display device according to claim 15, wherein the first-second connection part is vertically extended to the side surface of the first area of the light emitting unit,
wherein the first electrode comprises an extended electrode on a side surface of the light emitting unit, and
wherein the first-second connection part is in direct contact with the extended electrode of the first electrode.

* * * * *